US012769370B2

(12) United States Patent
Jung et al.

(10) Patent No.: US 12,769,370 B2
(45) Date of Patent: Oct. 20, 2026

(54) DISPLAY DEVICE AND ELECTRONIC DEVICE INCLUDING THE SAME

(71) Applicant: SAMSUNG DISPLAY CO., LTD., Yongin-si (KR)

(72) Inventors: Minkyoung Jung, Asan-si (KR); Heeyoung Lee, Hwaseong-si (KR); Ji-Hoon Kim, Hwaseong-si (KR); Eunmi Seo, Cheonan-si (KR); Minju Oh, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 265 days.

(21) Appl. No.: 17/938,374

(22) Filed: Oct. 6, 2022

(65) Prior Publication Data

US 2023/0205277 A1 Jun. 29, 2023

(30) Foreign Application Priority Data

Dec. 29, 2021 (KR) ........................ 10-2021-0191814

(51) Int. Cl.

*G06F 1/16* (2006.01)
*H10K 50/84* (2023.01)
*H10K 50/86* (2023.01)
*H10K 50/87* (2023.01)
*H10K 102/00* (2023.01)

(52) U.S. Cl.

CPC .......... *G06F 1/1656* (2013.01); *G06F 1/1616* (2013.01); *G06F 1/1643* (2013.01); *G06F 1/1652* (2013.01); *H10K 50/84* (2023.02); *H10K 50/865* (2023.02); *H10K 50/87* (2023.02); *H10K 2102/311* (2023.02)

(58) Field of Classification Search

CPC .............................. G06F 1/1656; H10K 50/84
See application file for complete search history.

(56) References Cited

U.S. PATENT DOCUMENTS

| | | | | |
|---|---|---|---|---|
| 10,854,690 | B2 | 12/2020 | Bae et al. | |
| 10,930,883 | B2 * | 2/2021 | Park | G06F 1/1641 |
| 11,271,055 | B2 | 3/2022 | Bae et al. | |
| 11,432,410 | B2 * | 8/2022 | Woo | G06F 3/0421 |
| 11,543,904 | B2 | 1/2023 | Bok et al. | |
| 11,556,146 | B2 | 1/2023 | Nam et al. | |

(Continued)

FOREIGN PATENT DOCUMENTS

| | | | |
|---|---|---|---|
| CN | 110444125 | A | 7/2020 |
| KR | 10-2017-0096565 | | 8/2017 |

(Continued)

*Primary Examiner* — Imani N Hayman
*Assistant Examiner* — Rashen E Morrison
(74) *Attorney, Agent, or Firm* — F. CHAU & ASSOCIATES, LLC

(57) ABSTRACT

A display device includes a display panel including a folding area and a non-folding area disposed adjacent to the folding area, and a first support plate disposed on a lower portion of the display panel. The non-folding area includes a first display area and a second display area disposed adjacent to the first display area and having a higher light transmittance than the first display area. A first hole overlapping the second display area is defined in the first support plate, and a size of the first hole is larger than a size of the second display area in a plan view.

20 Claims, 31 Drawing Sheets

(56) References Cited

U.S. PATENT DOCUMENTS

| | | | | | |
|---|---|---|---|---|---|
| 11,557,230 | B2 * | 1/2023 | Kim | ...................... | G06F 1/1637 |
| 11,832,406 | B2 * | 11/2023 | Kim | ...................... | G06F 1/1652 |
| 11,914,423 | B2 * | 2/2024 | Shin | .................... | H04M 1/0268 |
| 11,950,379 | B2 * | 4/2024 | Kim | .......................... | G06F 1/18 |
| 12,167,645 | B2 * | 12/2024 | Yun | ...................... | H10K 59/352 |
| 2017/0289324 | A1 * | 10/2017 | Yeo | ........................ | G03B 29/00 |
| 2020/0303677 | A1 * | 9/2020 | Lee | ...................... | H10K 50/844 |
| 2020/0393936 | A1 * | 12/2020 | Bok | ...................... | G06F 3/0448 |
| 2021/0066626 | A1 * | 3/2021 | Park | .................. | G02F 1/133305 |
| 2021/0068276 | A1 * | 3/2021 | Kim | ...................... | G06F 1/1652 |
| 2021/0135151 | A1 | 5/2021 | Baek et al. | | |
| 2021/0263562 | A1 * | 8/2021 | Min | ...................... | H04M 1/026 |
| 2021/0355725 | A1 * | 11/2021 | Hsu | ........................... | E05D 3/18 |
| 2022/0174823 | A1 * | 6/2022 | Kim | .......................... | G06F 1/18 |

FOREIGN PATENT DOCUMENTS

| | | | | | |
|---|---|---|---|---|---|
| KR | 10-2019-0091711 | | 8/2019 | | |
| KR | 10-2020-0089380 | A | 7/2020 | | |
| KR | 10-2020-0099251 | | 8/2020 | | |
| KR | 20220077953 | A * | 12/2020 | ............... | H05K 5/03 |
| KR | 10-2021-0013867 | A | 2/2021 | | |
| KR | 10-2021-0070880 | | 6/2021 | | |
| KR | 10-2021-0086907 | A | 7/2021 | | |
| KR | 10-2021-0106046 | A | 8/2021 | | |

* cited by examiner

DISPLAY DEVICE AND ELECTRONIC DEVICE INCLUDING THE SAME

CROSS-REFERENCE TO RELATED APPLICATION

This application claims priority under 35 U.S.C. § 119 to Korean Patent Application No. 10-2021-0191814, filed on Dec. 29, 2021, the disclosure of which is hereby incorporated by reference in its entirety.

TECHNICAL FIELD

Embodiments of the present inventive concept relate to a display device and an electronic device including the same.

DISCUSSION OF RELATED ART

In general, a display device includes a display module for displaying an image and a support part for supporting the display module. The display module includes a display panel for displaying an image, a window disposed on the display panel to protect the display panel from external scratches and impacts, and a protective layer disposed on a lower portion of the display panel to protect the display panel from external impacts. The support part has higher rigidity than the display module and supports the display module.

With the technological advancements of display devices, flexible display devices capable of being transformed into various shapes are being developed. Such flexible display devices include a flexible display module that is foldable or rollable. A support part disposed on a lower portion of the foldable display module that is folded about a folding axis has a structure in which the support part is folded together with the display module.

SUMMARY

Embodiments of the present inventive concept provide a display device capable of increasing image quality of a camera by preventing nonuniform sagging of a second display area on a camera hole, and an electronic device including the same.

An embodiment of the inventive concept provides a display device including a display panel including a folding area and a non-folding area disposed adjacent to the folding area, and a first support plate disposed on a lower portion of the display panel. The non-folding area includes a first display area and a second display area disposed adjacent to the first display area and having a higher light transmittance than the first display area. A first hole overlapping the second display area is defined in the first support plate, and in a plan view, a size of the first hole is larger than a size of the second display area.

In an embodiment of the inventive concept, a display device includes a display panel including a folding area and a non-folding area disposed adjacent to the folding area, a first support plate disposed on a lower portion of the display panel, a first functional layer disposed between the display panel and the first support plate, and a second functional layer disposed on a lower portion of the first support plate. The non-folding area includes a first display area and a second display area disposed adjacent to the first display area and having a higher light transmittance than the first display area. A first hole overlapping the second display area is defined in the first support plate, a second hole overlapping the second display area is defined in the first functional layer, and a third hole overlapping the second display area is defined in the second functional layer. In a plan view, a size of each of the first, second, and third holes is larger than a size of the second display area, and the size of the first hole is different from the size of each of the second and third holes.

In an embodiment of the inventive concept, an electronic device includes a display device in which a first transmissive area through which an optical signal passes is defined, an electro-optical device disposed below the display device, overlaps the first transmissive area, and configured to receive the optical signal, and a case configured to accommodate the display device and the electro-optical device. The display device includes a display panel including a folding area and a non-folding area disposed adjacent to the folding area, and a first support plate disposed on a lower portion of the display panel. The non-folding area includes a first display area and a second display area disposed adjacent to the first display area and having a higher light transmittance than the first display area. A first hole overlapping the second display area is defined in the first support plate, and in a plan view, a size of the first hole is larger than a size of the second display area.

BRIEF DESCRIPTION OF THE DRAWINGS

The above and other features of the present inventive concept will become more apparent by describing in detail embodiments thereof with reference to the accompanying drawings, in which.

DETAILED DESCRIPTION

Figure 1:
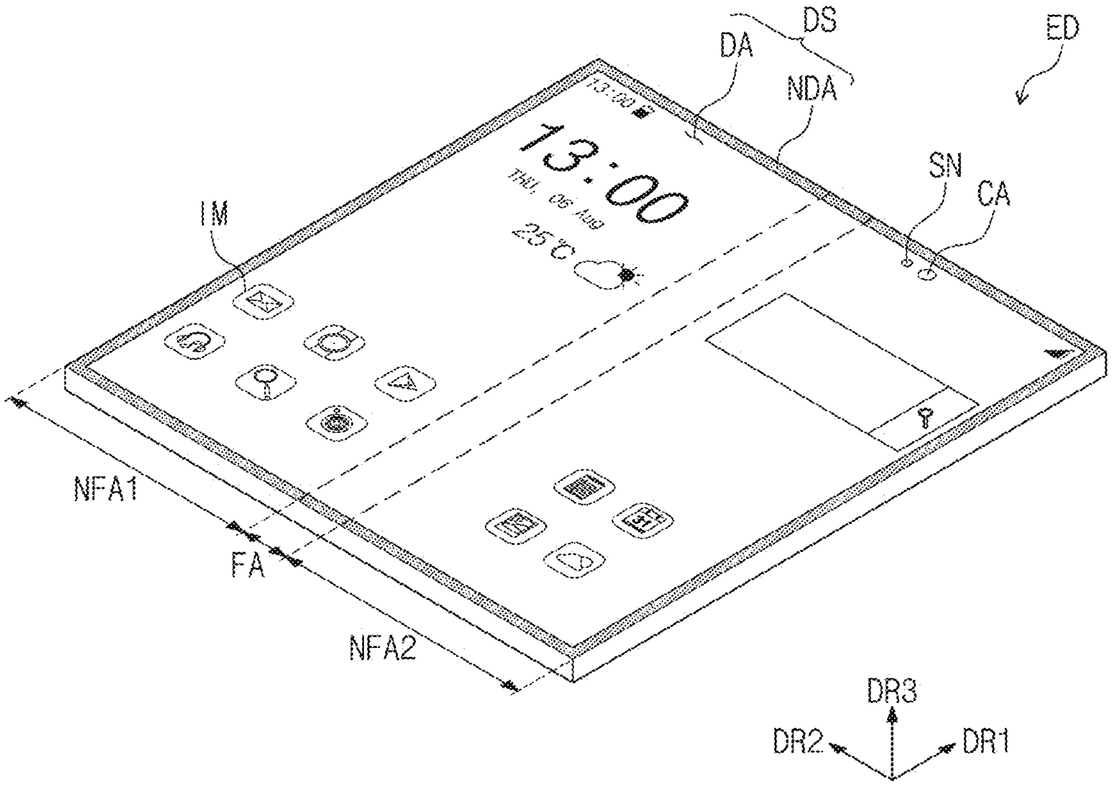
FIG. 1 is a perspective view of an electronic device according to an embodiment of the inventive concept.

Embodiments of the present inventive concept will be described more fully hereinafter with reference to the accompanying drawings. Like reference numerals may refer to like elements throughout the accompanying drawings.

It will be understood that when a component such as a film, a region, a layer, etc., is referred to as being “on”, “connected to”, “coupled to”, or “adjacent to” another component, it can be directly on, connected, coupled, or adjacent to the other component, or intervening components may be present. It will also be understood that when a component is referred to as being “between” two components, it can be the only component between the two components, or one or more intervening components may also be present. It will also be understood that when a component is referred to as “covering” another component, it can be the only component covering the other component, or one or more intervening components may also be covering the other component. Other words used to describe the relationships between components should be interpreted in a like fashion.

As used herein, the term “and/or” includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present inventive concept. As used herein, the singular forms, “a”, “an”, and “the” are intended to include the plural forms as well, unless the context clearly indicates otherwise.

Spatially relative terms, such as “beneath”, “below”, “lower”, “above”, and “upper”, may be used herein for ease of description to describe one element or feature’s relationship to another element(s) or feature(s) as illustrated in the figures. It will be understood that the spatially relative terms are intended to encompass different orientations of the device in use or operation in addition to the orientation depicted in the figures.

It will be further understood that the terms “include” or “have”, when used in this specification, specify the presence of stated features, integers, steps, operations, elements, components, and/or groups thereof, but do not preclude the presence or addition of one or more other features, integers, steps, operations, elements, components, and/or groups thereof.

It should be understood that descriptions of features or aspects within each embodiment should typically be considered as available for other similar features or aspects in other embodiments, unless the context clearly indicates otherwise.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term “about” as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, “about” may mean within one or more standard deviations as understood by one of the ordinary skill in the art. Further, it is to be understood that while parameters may be described herein as having “about” a certain value, according to embodiments, the parameter may be exactly the certain value or approximately the certain value within a measurement error as would be understood by a person having ordinary skill in the art. Other uses of these terms and similar terms to describe the relationships between components should be interpreted in a like fashion.

It will be further understood that when two components or directions are described as extending substantially parallel or perpendicular to each other, the two components or directions extend exactly parallel or perpendicular to each other, or extend approximately parallel or perpendicular to each other within a measurement error as would be understood by a person having ordinary skill in the art.

Figure 2:
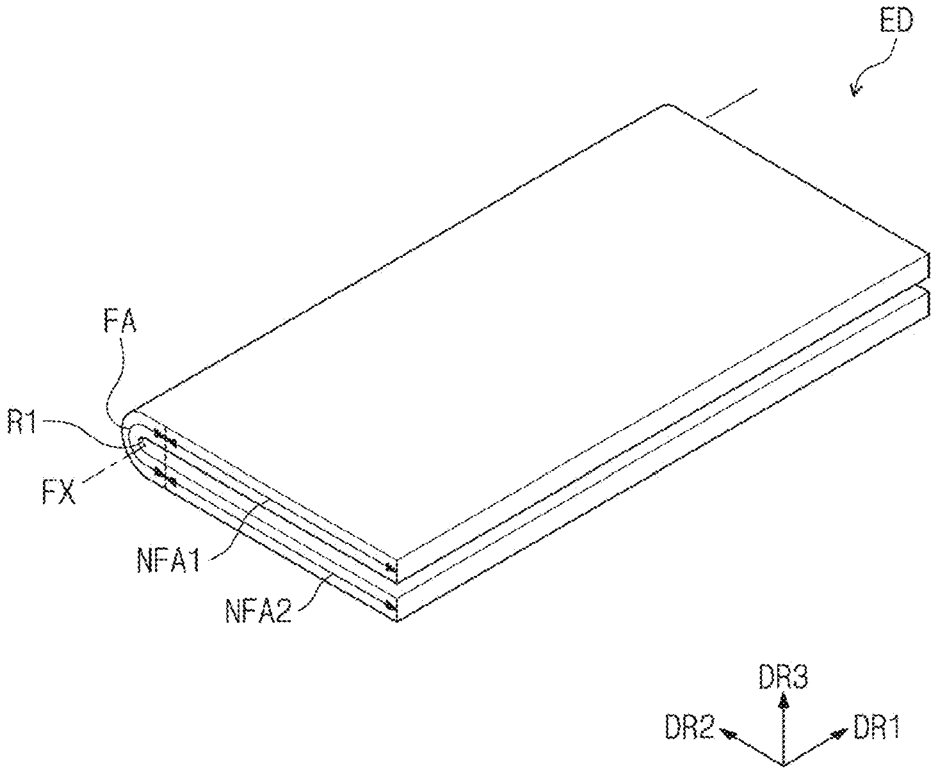
FIG. 2 and FIG. 3 illustrate folded states of the electronic device illustrated in FIG. 1 according to an embodiment of the inventive concept.
Figure 3:
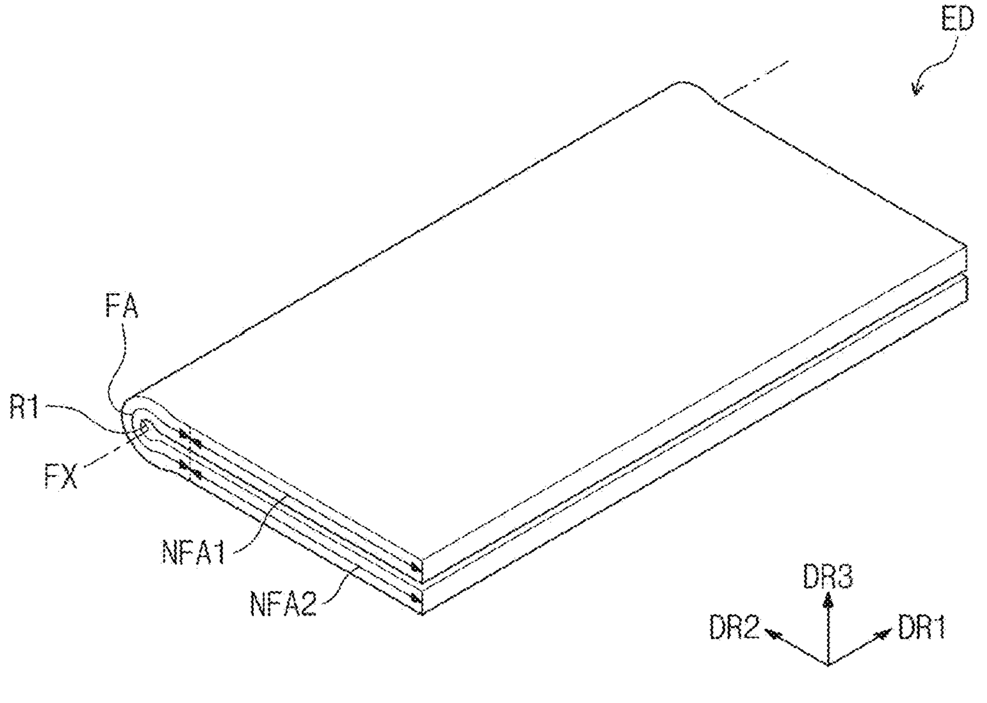

FIG. 1 is a perspective view of an electronic device according to an embodiment of the inventive concept. FIG. 2 and FIG. 3 illustrate folded states of the electronic device illustrated in FIG. 1 according to an embodiment of the inventive concept.

Referring to FIG. 1, an electronic device ED according to an embodiment of the inventive concept may have a rectangular shape with long sides extending in a first direction DR1 and short sides extending in a second direction DR2 crossing the first direction DR1. The long sides are relatively longer than the short sides. However, the electronic device ED is not limited thereto, and may have various shapes such as, for example, a circular shape and a polygonal shape. The electronic device ED may be a flexible display device.

Hereinafter, a direction substantially perpendicular to a plane defined by the first direction DR1 and the second direction DR2 is defined as a third direction DR3. In addition, in this specification, "when viewed in a plane", and "in a plan view", may be defined as referring to a state of being viewed in the third direction DR3.

The electronic device ED may include a folding area FA and a plurality of non-folding areas NFA1 and NFA2 disposed adjacent to the folding area FA. The non-folding areas NFA1 and NFA2 may include a first non-folding area NFA1 and a second non-folding area NFA2. The folding area FA may be disposed between the first non-folding area NFA1 and the second non-folding area NFA2. The folding area FA, the first non-folding area NFA1, and the second non-folding area NFA2 may be arranged in the second direction DR2.

A top surface of the electronic device ED may be defined as a display surface DS. The display surface DS may have a plane defined by the first direction DR1 and the second direction DR2. Images IM generated in the electronic device ED may be provided to a user through the display surface DS.

The display surface DS may include a display area DA and a non-display area NDA disposed around the display area DA. The display area DA may display an image, and an image is not displayed in the non-display area NDA. The non-display area NDA may surround the display area DA and define an edge of the electronic device ED, and may be printed in a predetermined color. For example, the non-display area NDA surrounding the display area DA may correspond to a bezel of the electronic device ED.

The electronic device ED may include at least one sensor SN and at least one camera CA. The sensor SN and the camera CA may be disposed adjacent to the edge of the electronic device ED. The sensor SN and the camera CA may be disposed in a portion of the display area DA disposed adjacent to the non-display area NDA. Although the sensor SN and the camera CA may be disposed in the second non-folding area NFA2, the sensor SN and the camera CA are not limited thereto, and may be disposed in the first non-folding area NFA1 according to embodiments.

Light may be provided to the camera CA and the sensor SN by being transmitted through portions of the electronic device ED in which the sensor SN and the camera CA are disposed. Exemplarily, the sensor SN may be a proximity and ambient light sensor, but the type of the sensor SN is not limited thereto. The camera CA may capture an external image. Each of the sensor SN and the camera CA may be provided in plurality.

Referring to FIGS. 2 and 3, the electronic device ED may be a foldable electronic device ED that is folded and unfolded. For example, the folding area FA may be bent about a folding axis FX substantially parallel to the first direction DR1, and thus, the electronic device ED may be folded. The folding axis FX may be defined as a long axis substantially parallel to the long sides of the electronic device ED.

When folded, the electronic device ED may be in-folded so that the first non-folding area NFA1 and the second non-folding area NFA2 face each other, and the display surface DS is not exposed to the outside. However, embodiments of the inventive concept are not limited thereto. For example, the electronic device ED may be out-folded about the folding axis FX so that the display surface DS is exposed to the outside.

As illustrated in FIG. 2, a distance between the first non-folding area NFA1 and the second non-folding area NFA2 may be substantially equal to twice a radius of curvature R1. However, embodiments of the inventive concept are not limited thereto, and as illustrated in FIG. 3, the distance between the first non-folding area NFA1 and the second non-folding area NFA2 may be shorter than twice the radius of curvature R1 in an embodiment.

Figure 4:
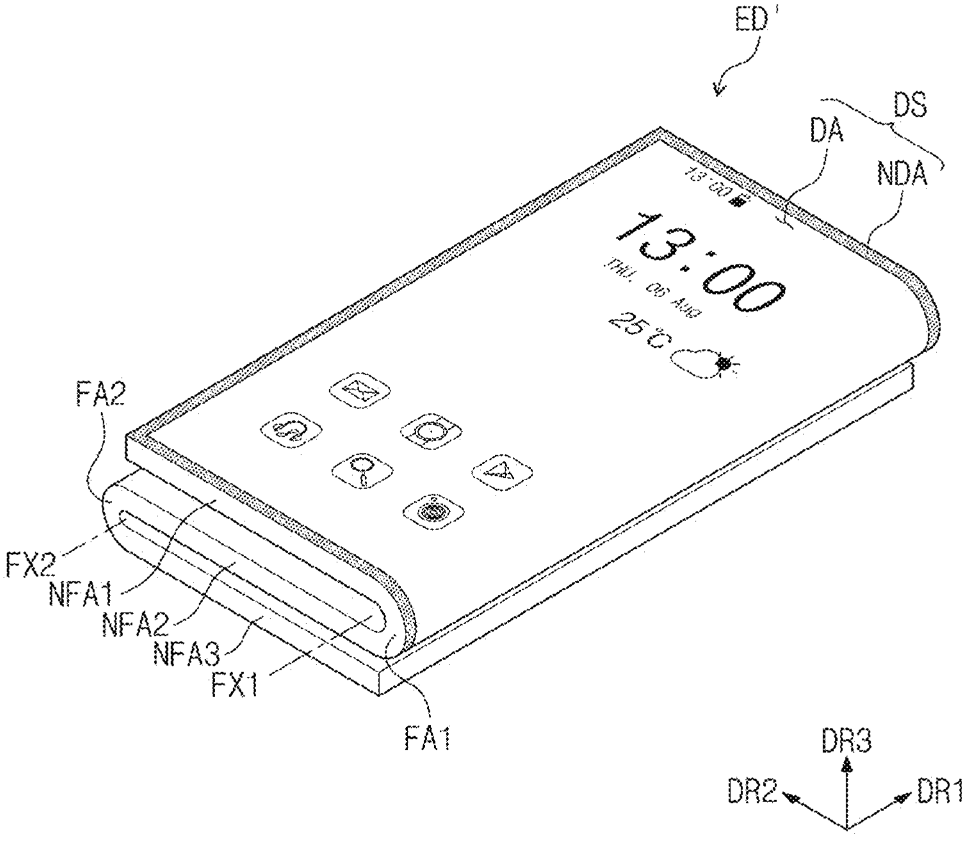
FIG. 4 illustrates a folded state of an electronic device according to an embodiment of the inventive concept.

FIG. 4 illustrates a folded state of an electronic device according to an embodiment of the inventive concept.

Although one folding area FA and two non-folding areas NFA1 and NFA2 are exemplarily illustrated in FIGS. 2 and 3, the number of folding areas FA and the number of non-folding areas NFA1 and NFA2 are not limited thereto. For example, as illustrated in FIG. 4, in an embodiment, an electronic device ED' may include three or more non-folding areas NFA1, NFA2, and NFA3 and a plurality of folding areas FA1 and FA2 disposed between the non-folding areas NFA1, NFA2, and NFA3.

The non-folding areas NFA1, NFA2, and NFA3 may include a first non-folding area NFA1, a second non-folding area NFA2, and a third non-folding area NFA3. The folding areas FA1 and FA2 may include a first folding area FA1 disposed between the first non-folding area NFA1 and the second non-folding area NFA2 and a second folding area FA2 disposed between the second non-folding area NFA2 and the third non-folding area NFA3.

The first folding area FA1 may be bent about a first folding axis FX1 substantially parallel to a first direction DR1, and the second folding area FA2 may be bent about a second folding axis FX2 substantially parallel to the first direction DR1, so that the electronic device ED' may be multi-folded. The first non-folding area NFA1 may be out-folded with respect to the second non-folding area NFA2, and the second non-folding area NFA2 and the third non-folding area NFA3 may be in-folded.

Figure 5:
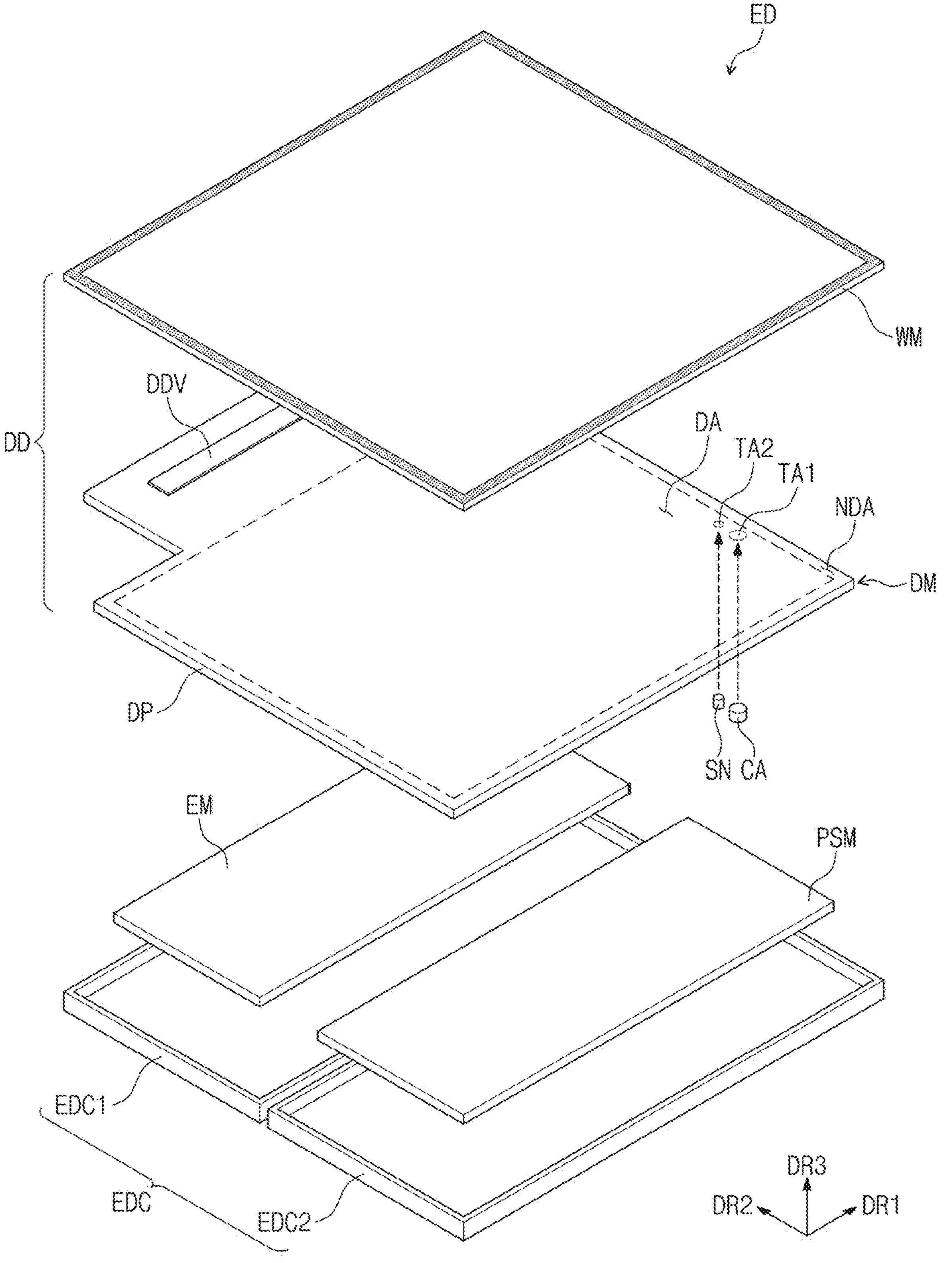
FIG. 5 is an exploded perspective view of the electronic device illustrated in FIG. 1 according to an embodiment of the inventive concept.

FIG. 5 is an exploded perspective view of the electronic device illustrated in FIG. 1 according to an embodiment of the inventive concept.

Referring to FIG. 5, the electronic device ED may include a display device DD, the camera CA, the sensor SN, an electronic module EM, a power module PSM, and a case EDC. In an embodiment, a mechanical structure (e.g., a hinge) for controlling the folding operation of the display device DD may be further included in the electronic device ED.

The display device DD may generate an image and sense an external input. The display device DD may include a window module WM and a display module DM. The window module WM may provide a front surface of the electronic device ED. The window module WM may be disposed on the display module DM to protect the display module DM. The window module WM may transmit light generated by the display module DM and provide the light to a user.

The display module DM may include at least a display panel DP. Although only the display panel DP of a laminated structure of the display module DM is illustrated in FIG. 1 and likewise in FIG. 4, embodiments are not limited thereto. For example, according to an embodiment, the display module DM may substantially further include a plurality of components disposed on upper and lower portions of the display panel DP. The laminated structure of the display module DM will be described in detail below.

The display panel DP may include a display area DA and a non-display area NDA respectively corresponding to the display area DA (see FIG. 1) and the non-display area NDA (see FIG. 1) of the electronic device ED. In this specification, "an area/portion corresponds to another area/portion" means that the two areas/portions overlap each other, and the two areas/portions are not limited to having the same surface area.

A first transmissive area TA1 and a second transmissive area TA2 may be defined in the display panel DP. The first and second transmissive areas TA1 and TA2 may have higher light transmittance than an area disposed around the first and second transmissive areas TA1 and TA2. The camera CA may be disposed below the first transmissive area TA1, and the sensor SN may be disposed below the second transmissive area TA2. Light passing through the first and second transmissive areas TA1 and TA2 may be provided to the camera CA and the sensor SN.

The display module DM may include a data driver DDV disposed on the non-display area NDA of the display panel DP. The data driver DDV may be manufactured in the form of an integrated circuit chip and mounted on the non-display area NDA. However, the data driver DDV is not limited thereto and may be mounted on a flexible circuit board connected to the display panel DP.

The electronic module EM and the power module PSM may be disposed below the display device DD. In an embodiment, the electronic module EM and the power module PSM may be connected to each other through a separate flexible circuit board. The electronic module EM may control the operation of the display device DD. The power module PSM may supply power to the electronic module EM.

The case EDC may accommodate the display device DD, the electronic module EM, and the power module PSM. The case EDC may protect the display device DD, the electronic module EM, and the power module PSM. The case EDC may include two cases, e.g., first and second cases EDC1 and EDC2 to allow the display device DD to be folded. The first and second cases EDC1 and EDC2 may each extend in the first direction DR1 and may be arranged in the second direction DR2.

In an embodiment, a hinge structure for connecting the first and second cases EDC1 and EDC2 to each other may be further included in the electronic device ED.

Figure 6:
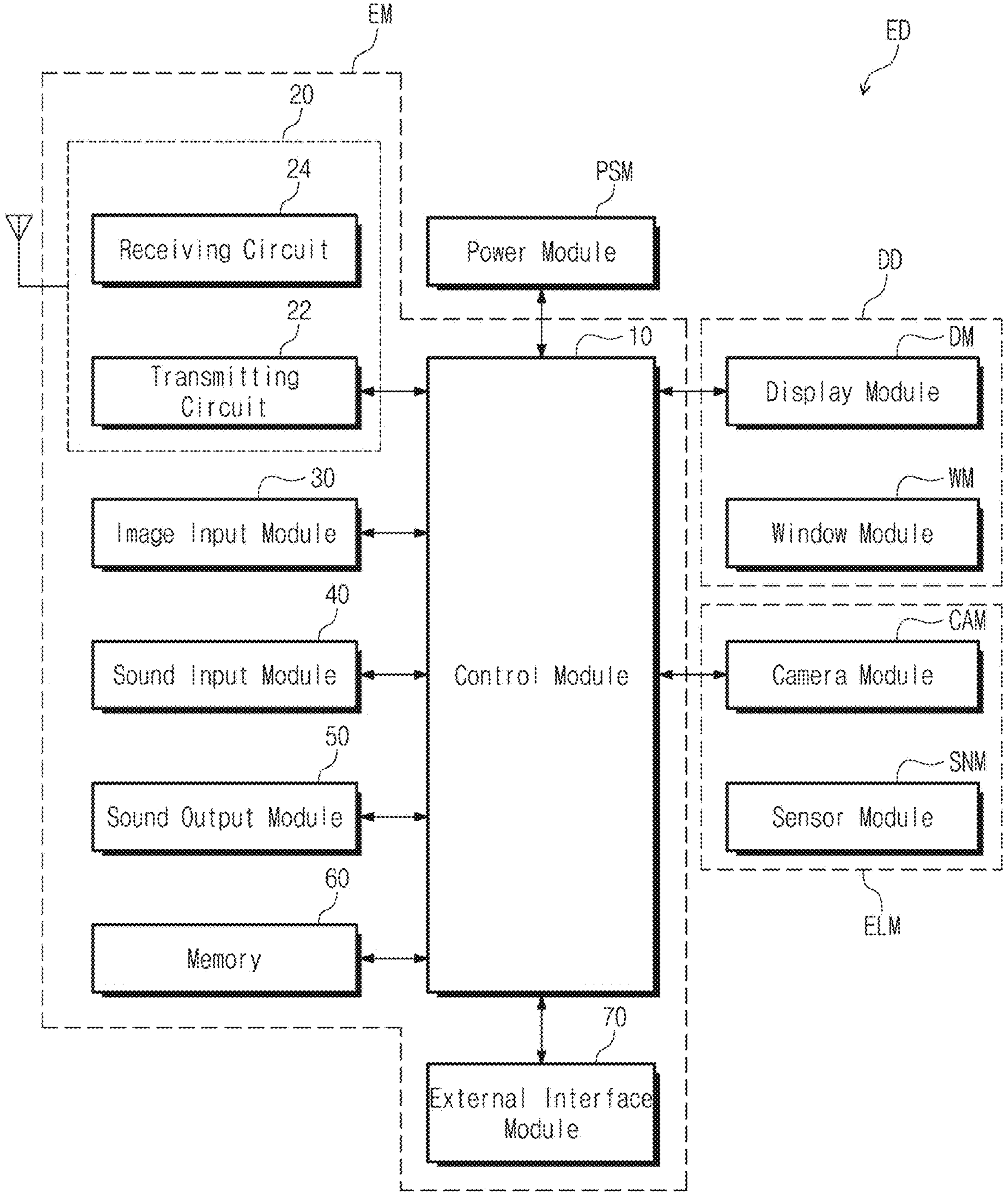
FIG. 6 is a block diagram of the electronic device illustrated in FIG. 5 according to an embodiment of the inventive concept.

FIG. 6 is a block diagram of the electronic device illustrated in FIG. 5 according to an embodiment of the inventive concept.

Referring to FIG. 6, the electronic device ED may include the electronic module EM, the power module PSM, the display device DD, and an electro-optical device ELM. The electronic module EM may include a control module 10, a wireless communication module 20, an image input module 30, a sound input module 40, a sound output module 50, a memory 60, an external interface module 70, etc. The modules may be mounted on a circuit board or may be electrically connected through a flexible circuit board. The electronic module EM may be electrically connected to the power module PSM.

The control module 10 may control an overall operation of the electronic device ED. For example, the control module 10 may activate or deactivate the display device DD according to a user's input. The control module 10 may control the image input module 30, the sound input module 40, the sound output module 50, etc. according to a user's input. The control module 10 may include at least one microprocessor.

The wireless communication module 20 may transmit/receive a radio signal to/from another terminal using, for example, a BLUETOOTH or WI-FI channel. The wireless communication module 20 may transmit/receive a voice signal by using a general communication channel. The wireless communication module 20 may include a transmitting circuit 22 for modulating and transmitting a signal to be transmitted, and a receiving circuit 24 for demodulating a received signal.

The image input module 30 may process an image signal and convert the processed image signal into image data that may be displayed on the display device DD. The sound input module 40 may receive an external sound signal using a microphone in, for example, a recording mode, a voice recognition mode, etc., and may convert the received external sound signal into electrical voice data. The sound output module 50 may convert sound data received from the wireless communication module 20 or sound data stored in the memory 60 and may output the converted sound data to outside of the electronic device ED.

The external interface module 70 may serve as an interface which is connected to, for example, an external charger, a wired/wireless data port, a card socket (e.g., a memory card and a SIM/UIM card), etc.

The power module PSM may supply power utilized for the overall operation of the electronic device ED. The power module PSM may include a battery device.

The electro-optical device ELM may be an electronic part that outputs or receives an optical signal. The electro-optical device ELM may transmit or receive the optical signal through a partial area of the display device DD. In an embodiment, the electro-optical device ELM may include a camera module CAM and a sensor module SNM. The camera module CAM may include the camera CA illustrated in FIG. 5. The sensor module SNM may include the sensor SN illustrated in FIG. 5.

Figure 7:
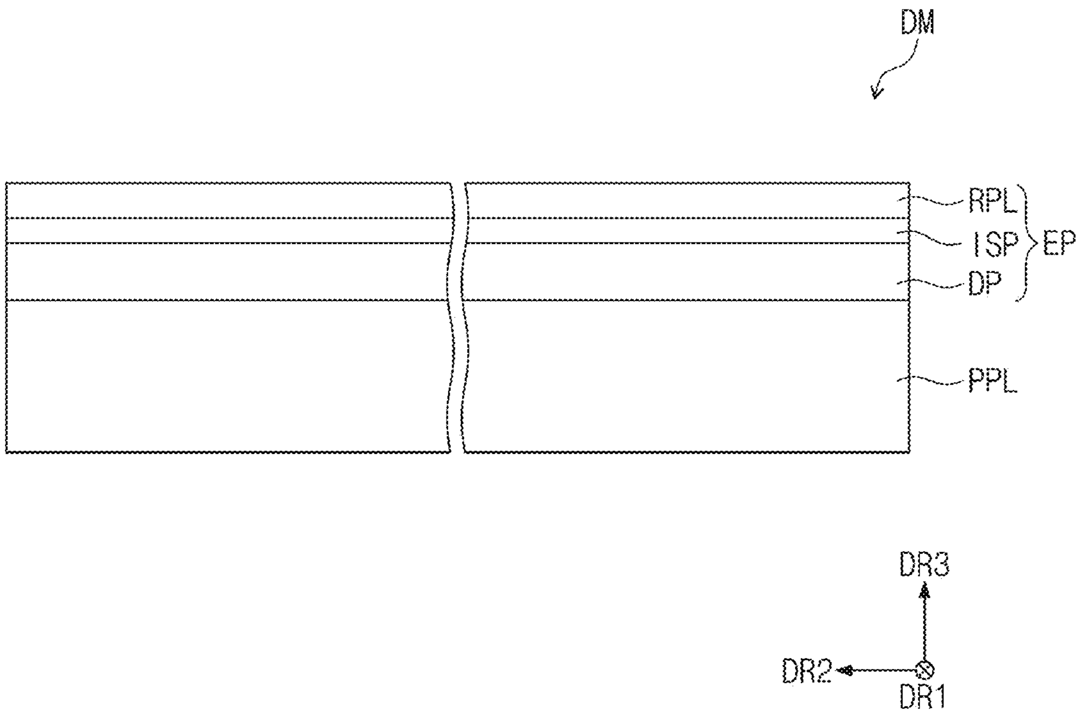
FIG. 7 is a schematic cross-sectional view of the display module illustrated in FIG. 5.

FIG. 7 is a schematic cross-sectional view of the display module illustrated in FIG. 5 according to an embodiment of the inventive concept.

Referring to FIG. 7, the display module DM may include an electronic panel EP and a panel protective layer PPL disposed on a lower portion of the electronic panel EP. The electronic panel EP may include the display panel DP, an input sensing unit ISP disposed on the display panel DP, and an anti-reflection layer RPL disposed on the input sensing unit ISP. The display panel DP may be a flexible display panel. For example, the display panel DP may include a flexible substrate and a plurality of elements disposed on the flexible substrate.

The display panel DP according to an embodiment of the inventive concept may be a light emitting display panel, but is not particularly limited thereto. For example, the display panel DP may be an organic light emitting display panel or an inorganic light emitting display panel. A light emitting layer of the organic light emitting display panel may include an organic light emitting material. A light emitting layer of the inorganic light emitting display panel may include, for example, quantum dots, quantum rods, etc. Hereinafter, the display panel DP is described as being an organic light emitting display panel.

The input sensing unit ISP may include a plurality of sensors for sensing an external input in a capacitive method. The input sensing unit ISP may be formed directly on the display panel DP when the display module DM is manufactured.

The anti-reflection layer RPL may be disposed on the input sensing unit ISP. The anti-reflection layer RPL may be formed directly on the input sensing unit ISP when the display module DM is manufactured. The anti-reflection layer RPL may be defined as a film that prevents or reduces reflection of external light. The anti-reflection layer RPL may reduce the degree of reflection of external light incident on the display panel DP from above the display device DD.

Exemplarily, the input sensing unit ISP may be formed directly on the display panel DP, and the anti-reflection layer RPL may be formed directly on the input sensing unit ISP, but embodiments of the inventive concept are not limited thereto. For example, the input sensing unit ISP may be manufactured separately and attached to the display panel DP by an adhesive layer, and the anti-reflection layer RPL may be manufactured separately and attached to the input sensing unit ISP by an adhesive layer.

The panel protective layer PPL may be disposed on a lower portion of the display panel DP. The panel protective layer PPL may protect the lower portion of the display panel DP. The panel protective layer PPL may include a flexible plastic material. For example, the panel protective layer PPL may include polyethylene terephthalate (PET).

Figure 8:
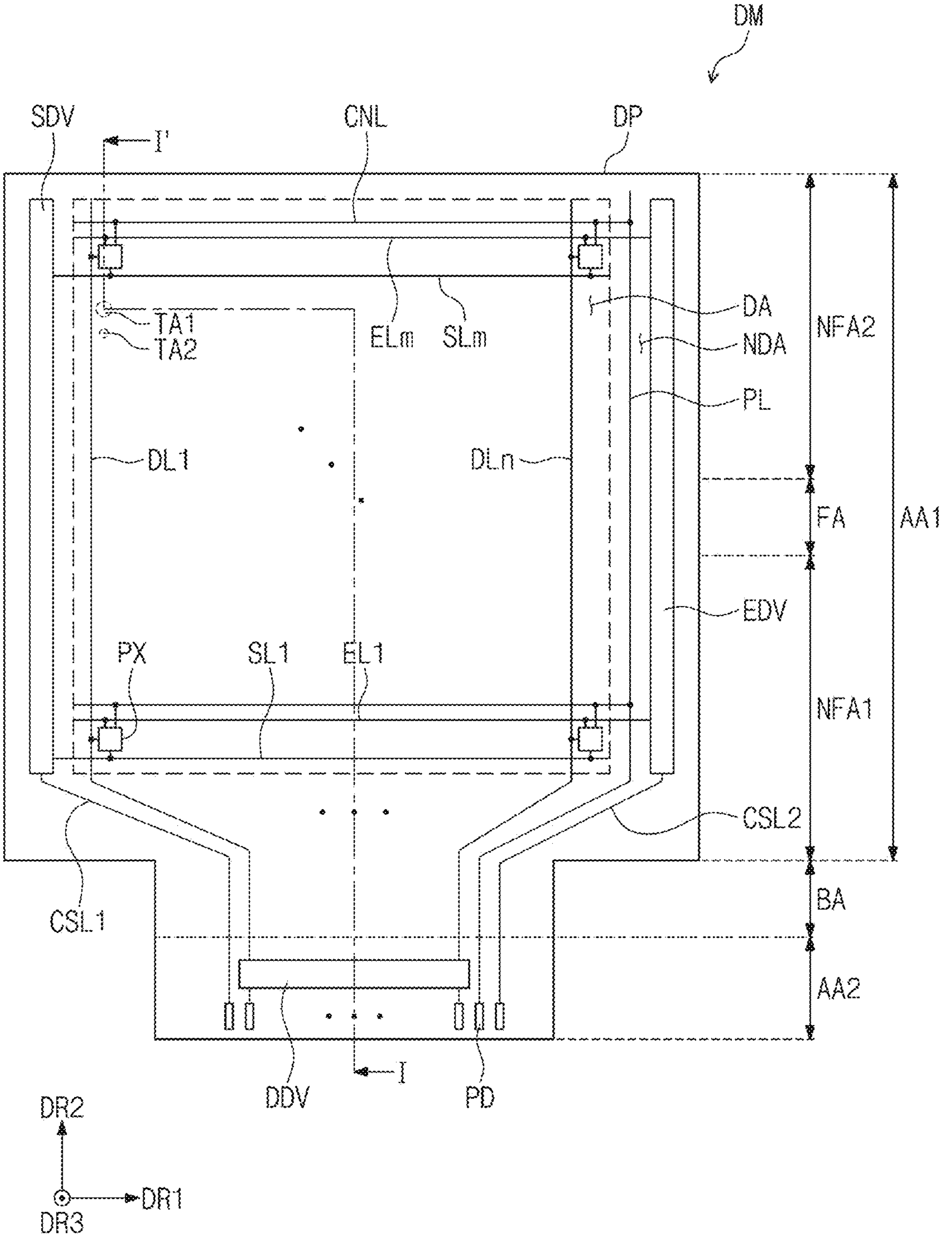
FIG. 8 is a plan view of the display panel illustrated in FIG. 5 according to an embodiment of the inventive concept.

FIG. 8 is a plan view of the display panel illustrated in FIG. 5 according to an embodiment of the inventive concept.

Referring to FIG. 8, the display module DM may include the display panel DP, a scan driver SDV, the data driver DDV, and an emission driver EDV.

The display panel DP may include a first area AA1, a second area AA2, and a bending area BA disposed between the first area AA1 and the second area AA2. The bending area BA may extend in the first direction DR1, and the first area AA1, the bending area BA, and the second area AA2 may be arranged in the second direction DR2.

The first area AA1 may include the display area DA and the non-display area NDA disposed around the display area DA. The non-display area NDA may surround the display area DA. The display area DA may be an area which displays an image, and the non-display area NDA may be an area which does not display an image. The second area AA2 and the bending area BA may be areas which do not display images.

The first area AA1 may include, when viewed in the first direction DR1, a first non-folding area NFA1, a second non-folding area NFA2, and a folding area FA disposed between the first non-folding area NFA1 and the second non-folding area NFA2. The above-described first and second transmissive areas TA1 and TA2 may be defined in the display area DA and the second non-folding area NFA2. Thus, for convenience of explanation, a further description therein is omitted.

The display panel DP may include a plurality of pixels PX, a plurality of scan lines SL1 to SLm, a plurality of data lines DL1 to DLn, a plurality of emission lines EL1 to ELm, first and second control lines CSL1 and CSL2, a power line PL, connection lines CNL, and a plurality of pads PD. Here, m and n are positive integers. The pixels PX may be disposed in the display area DA and may be connected to the scan lines SL1 to SLm, the data lines DL1 to DLn, and the emission lines EL1 to ELm.

The scan driver SDV and the emission driver EDV may be disposed in the non-display area NDA. The scan driver SDV and the emission driver EDV may be respectively disposed in two portions of the non-display area NDA respectively disposed adjacent to two sides of the first area AA1 opposite to each other in the first direction DR1. The data driver DDV may be disposed in the second area AA2. The data driver DDV may be manufactured in the form of an integrated circuit chip and mounted on the second area AA2.

The scan lines SL1 to SLm may extend in the first direction DR1 and may be connected to the scan driver SDV. The data lines DL1 to DLn may extend in the second direction DR2 and may be connected to the data driver DDV via the bending area BA. The emission lines EL1 to ELm may extend in the first direction DR1 and be connected to the emission driver EDV.

The power line PL may extend in the second direction DR2 and may be disposed in the non-display area NDA. Although the power line PL may be disposed between the display area DA and the emission driver EDV, the power line PL is not limited thereto, and may be disposed, for example, between the display area DA and the scan driver SDV.

The power line PL may extend to the second area AA2 via the bending area BA. In a plan view, the power line PL may extend toward a lower end of the second area AA2. The power line PL may receive a driving voltage.

The connection lines CNL may extend in the first direction DR1 and may be arranged in the second direction DR2. The connection lines CNL may be connected to the power line PL and the pixels PX. The driving voltage may be applied to the pixels PX through the power line PL and the connection lines CNL connected to each other.

The first control line CSL1 may be connected to the scan driver SDV and may extend toward the lower end of the second area AA2 via the bending area BA. The second control line CSL2 may be connected to the emission driver EDV and may extend toward the lower end of the second area AA2 via the bending area BA. The data driver DDV may be disposed between the first control line CSL1 and the second control line CSL2.

In a plan view, the pads PD may be disposed adjacent to the lower end of the second area AA2. The data driver DDV, the power line PL, the first control line CSL1, and the second control line CSL2 may be connected to the pads PD.

The data lines DL1 to DLn may be connected to corresponding pads PD through the data driver DDV. For example, the data lines DL1 to DLn may be connected to the data driver DDV, and the data driver DDV may be connected to the pads PD respectively corresponding to the data lines DL1 to DLn.

A printed circuit board may be connected to the pads PD in an embodiment, and a timing controller and a voltage generator may be disposed on the printed circuit board. The timing controller may be manufactured as an integrated circuit chip and mounted on the printed circuit board. The timing controller and the voltage generator may be connected to the pads PD through the printed circuit board.

The timing controller may control operations of the scan driver SDV, the data driver DDV, and the emission driver EDV. The timing controller may generate a scan control signal, a data control signal, and an emission control signal in response to control signals received from outside of the timing controller. The voltage generator may generate the driving voltage.

The scan control signal may be provided to the scan driver SDV through the first control line CSL1. The emission control signal may be provided to the emission driver EDV through the second control line CSL2. The data control signal may be provided to the data driver DDV. The timing controller may receive image signals from outside of the timing controller, and may convert a data format of the image signals according to an interface specification between the timing controller and the data driver DDV to provide the image signals having the converted data format to the data driver DDV.

The scan driver SDV may generate a plurality of scan signals in response to the scan control signal. The scan signals may be applied to the pixels PX through the scan lines SL1 to SLm. The scan signals may be sequentially applied to the pixels PX.

The data driver DDV may generate a plurality of data voltages corresponding to the image signals in response to the data control signal. The data voltages may be applied to the pixels PX through the data lines DL1 to DLn. The emission driver EDV may generate a plurality of emission signals in response to the emission control signal. The emission signals may be applied to the pixels PX through the emission lines EL1 to ELm.

The pixels PX may receive the data voltages in response to the scan signals. The pixels PX may display an image by emitting light of luminance values corresponding to the data voltages in response to the emission signals. The emission times of the pixels PX may be controlled by the emission signals.

Figure 9:
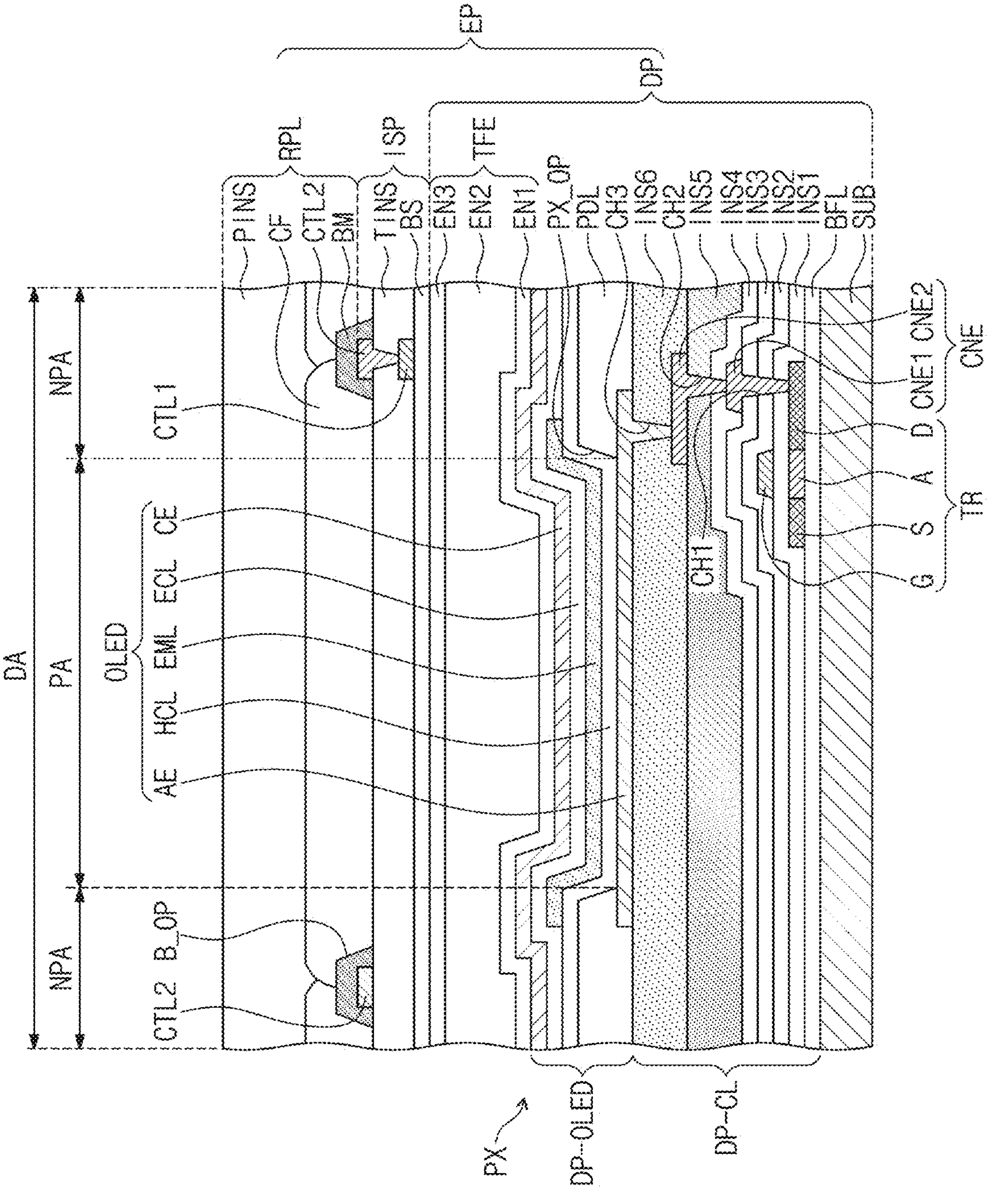
FIG. 9 exemplarily illustrates a cross-section of an electronic panel corresponding to one of the pixels illustrated in FIG. 8 according to an embodiment of the inventive concept.

FIG. 9 exemplarily illustrates a cross-section of an electronic panel corresponding to one of the pixels illustrated in FIG. 8 according to an embodiment of the inventive concept.

Referring to FIG. 9, each of the pixels PX may include a transistor TR and a light emitting element OLED. The light emitting element OLED may include a first electrode AE (or an anode AE), a second electrode CE (or a cathode CE), a hole control layer HCL, an electron control layer ECL, and a light emitting layer EML.

The transistor TR and the light emitting element OLED may be disposed on a substrate SUB. Although one transistor TR is exemplarily illustrated in FIG. 9, the pixel PX may substantially include a plurality of transistors and at least one capacitor for driving the light emitting element OLED according to embodiments.

The display area DA may include a light emitting area PA corresponding to each of the pixels PX and a non-light emitting area NPA disposed around the light emitting area PA. The light emitting element OLED may be disposed in the light emitting area PA.

A buffer layer BFL may be disposed on the substrate SUB and may be an inorganic layer. A semiconductor pattern may be disposed on the buffer layer BFL. The semiconductor pattern may include, for example, polysilicon, amorphous silicon, or metal oxide.

The semiconductor pattern may be doped with an N-type dopant or a P-type dopant. The semiconductor pattern may include a highly doped region and a lowly doped region. The highly doped region may have a higher conductivity than the lowly doped region and may substantially serve as a source electrode and a drain electrode of the transistor TR. The lowly doped region may substantially correspond to an active (or a channel) of the transistor.

A source S, an active A, and a drain D of the transistor TR may be formed from the semiconductor pattern. A first insulating layer INS1 may be disposed on the semiconductor pattern. A gate G of the transistor TR may be disposed on the first insulating layer INS1. A second insulating layer INS2 may be disposed on the gate G. A third insulating layer INS3 may be disposed on the second insulating layer INS2.

A connection electrode CNE may include a first connection electrode CNE1 and a second connection electrode CNE2 that connect the transistor TR and the light emitting element OLED. The first connection electrode CNE1 may be disposed on the third insulating layer INS3 and may be connected to the drain D through a first contact hole CH1 defined in the first to third insulating layers INS1 to INS3.

A fourth insulating layer INS4 may be disposed on the first connection electrode CNE1. A fifth insulating layer INS5 may be disposed on the fourth insulating layer INS4. The second connection electrode CNE2 may be disposed on the fifth insulating layer INS5. The second connection electrode CNE2 may be connected to the first connection electrode CNE1 through a second contact hole CH2 defined in the fourth and fifth insulating layers INS4 and INS5.

A sixth insulating layer INS6 may be disposed on the second connection electrode CNE2. The layers from the buffer layer BFL to the sixth insulating layer INS6 may be defined as a circuit element layer DP-CL. The first insulating layer INS1 to the sixth insulating layer INS6 may be an inorganic layer or an organic layer.

The first electrode AE may be disposed on the sixth insulating layer INS6. The first electrode AE may be connected to the second connection electrode CNE2 through a third contact hole CH3 defined in the sixth insulating layer INS6. A pixel defining film PDL in which an opening PX_OP for exposing a predetermined portion of the first electrode AE is defined may be disposed on the first electrode AE and the sixth insulating layer INS6.

The hole control layer HCL may be disposed on the first electrode AE and the pixel defining film PDL. The hole control layer HCL may include a hole transport layer and a hole injection layer.

The light emitting layer EML may be disposed on the hole control layer HCL. The light emitting layer EML may be disposed in an area corresponding to the opening PX_OP. The light emitting layer EML may include an organic material and/or an inorganic material. The light emitting layer EML may generate light of any one of red, green, and blue.

The electron control layer ECL may be disposed on the light emitting layer EML and the hole control layer HCL. The electron control layer ECL may include an electron transport layer and an electron injection layer. The hole control layer HCL and the electron control layer ECL may be disposed in common in the light emitting area PA and the non-light emitting area NPA.

The second electrode CE may be disposed on the electron control layer ECL. The second electrode CE may be disposed in common in the pixels PX. The layers where the light emitting element OLED is disposed may be defined as a display element layer DP-OLED.

A thin film encapsulation layer TFE may be disposed on the second electrode CE and may cover the pixel PX. The thin film encapsulation layer TFE may include a first encapsulation layer EN1 disposed on the second electrode CE, a second encapsulation layer EN2 disposed on the first encapsulation layer EN1, and a third encapsulation layer EN3 disposed on the second encapsulation layer EN2.

The first and third encapsulation layers EN1 and EN3 may each include an inorganic insulating layer and may protect the pixel PX from moisture/oxygen. The second encapsulation layer EN2 may include an organic insulating layer and may protect the pixel PX from foreign matter such as dust particles.

A first voltage may be applied to the first electrode AE through the transistor TR, and a second voltage having a level lower than that of the first voltage may be applied to the second electrode CE. Holes and electrons injected into the light emitting layer EML may combine to form excitons, and as the excitons transition to a ground state, the light emitting element OLED may emit light.

The input sensing unit ISP may be disposed on the thin film encapsulation layer TFE. The input sensing unit ISP may be manufactured directly on a top surface of the thin film encapsulation layer TFE.

A base layer BS may be disposed on the thin film encapsulation layer TFE. The base layer BS may include an inorganic insulating layer. At least one inorganic insulating layer may be provided on the thin film encapsulation layer TFE as the base layer BS.

The input sensing unit ISP may include a first conductive pattern CTL1 and a second conductive pattern CTL2 disposed on the first conductive pattern CTL1. The first conductive pattern CTL1 may be disposed on the base layer BS. An insulating layer TINS may be disposed on the base layer BS and may cover the first conductive pattern CTL1. The insulating layer TINS may include an inorganic insulating layer or an organic insulating layer. The second conductive pattern CTL2 may be disposed on the insulating layer TINS.

The first and second conductive patterns CTL1 and CTL2 may overlap the non-light emitting area NPA. The light emitting area PA may be provided in plurality. In an embodiment, the first and second conductive patterns CTL1 and CTL2 may be disposed in the non-light emitting area NPA between the light emitting areas PA and may have a mesh shape.

The first and second conductive patterns CTL1 and CTL2 may form the aforementioned sensors of the input sensing unit ISP. For example, the first and second conductive patterns CTL1 and CTL2 of the mesh shape may be separated from each other in a predetermined area to form the sensors. A portion of the second conductive pattern CTL2 may be connected to the first conductive pattern CTL1.

The anti-reflection layer RPL may be disposed on the second conductive pattern CTL2. The anti-reflection layer RPL may be manufactured directly on the second conductive pattern CTL2 and the insulating layer TINS. The anti-reflection layer RPL may include a black matrix BM and a plurality of color filters CF. The black matrix BM may overlap the non-light emitting area NPA, and the color filters CF may respectively overlap the light emitting areas PA.

The black matrix BM may be disposed on the insulating layer TINS and may cover the second conductive pattern CTL2. Openings B_OP each overlapping the light emitting area PA and the opening PX_OP may be defined in the black matrix BM. A width of each of the openings B_OP may be greater than a width of the opening PX_OP. The black matrix BM may absorb and block light.

The color filters CF may be disposed on the insulating layer TINS and the black matrix BM. The color filters CF may be respectively disposed in the openings B_OP. A planarization insulating layer PINS may be disposed on the color filters CF. The planarization insulating layer PINS may provide a flat top surface.

When external light traveling toward the display panel DP is reflected by the display panel DP and provided again to an external user, the user may view the external light, resulting in a phenomenon similar to when the user looks into a mirror. To prevent this phenomenon, the anti-reflection layer RPL may exemplarily include the plurality of color filters CF respectively having the same colors as the pixels PX of the display panel DP. The color filters CF may filter external light into colors that are respectively the same as those of the pixels PX. In this case, according to embodiments of the inventive concept, the external light is not viewable to the user.

However, embodiments of the inventive concept are not limited thereto. For example, according to embodiments, the anti-reflection layer RPL may include a polarizing film that may reduce the degree of reflection of external light. The polarizing film may be manufactured separately and attached to the input sensing unit ISP by an adhesive layer. The polarizing film may include a retarder and/or a polarizer.

Figure 10:
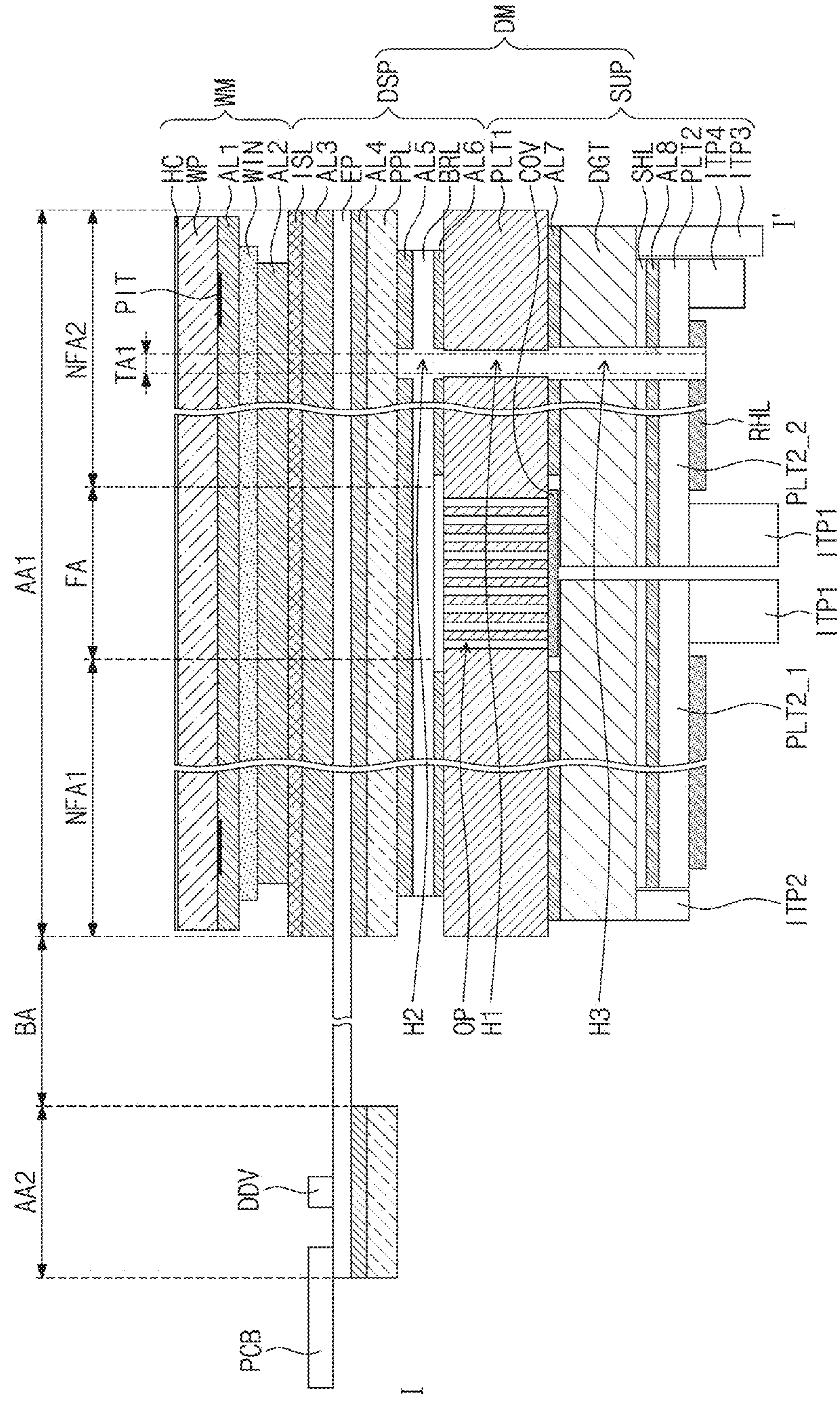
FIG. 10 is a cross-sectional view taken along line I-I' illustrated in FIG. 8 according to an embodiment of the inventive concept.
Figure 11:
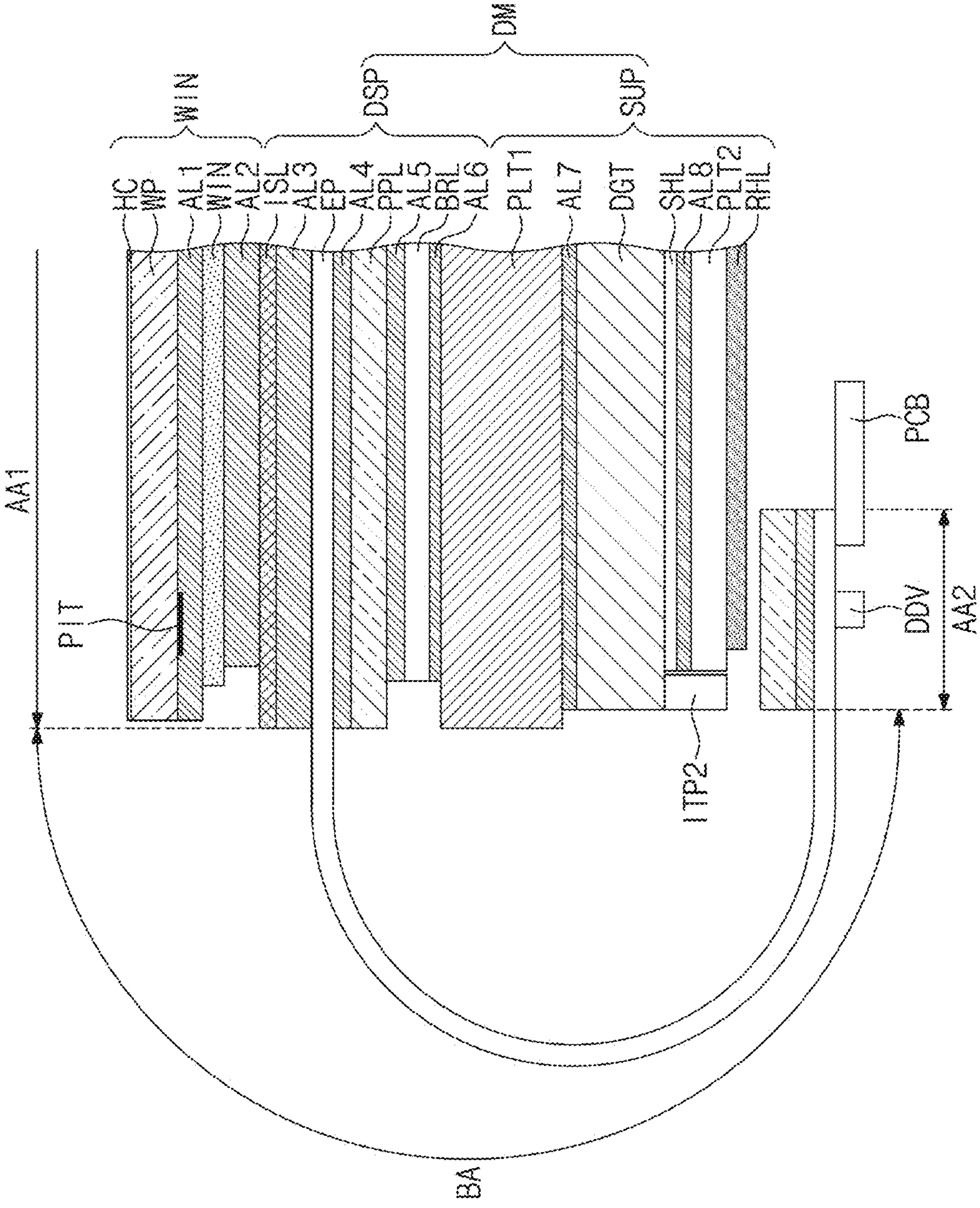
FIG. 11 illustrates a state in which the bending area illustrated in FIG. 10 is bent according to an embodiment of the inventive concept.

FIG. 10 is a cross-sectional view taken along line I-I' illustrated in FIG. 8 according to an embodiment of the inventive concept. FIG. 11 illustrates a state in which the bending area illustrated in FIG. 10 is bent according to an embodiment of the inventive concept.

Exemplarily, FIG. 10 illustrates a cross-section of the display module DM and a cross-section of the window module WM corresponding to the line I-I' together.

Referring to FIG. 10, the display device DD may include the display module DM and the window module WM disposed on the display module DM. The display module DM may be a flexible display module. The display module DM may include a first non-folding area NFA1, a folding area FA, and a second non-folding area NFA2.

The display module DM may include a display unit DSP and a support part SUP. The support part SUP may be disposed on a lower portion of the display unit DSP and may support the display unit DSP.

The window module WM may include a window WIN, a window protective layer WP, a hard coating layer HC, and first and second adhesive layers AL1 and AL2. The display unit DSP may include the electronic panel EP, an impact absorbing layer ISL, the panel protective layer PPL, a barrier layer BRL, and third to sixth adhesive layers AL3 to AL6. Because the configurations of the electronic panel EP and the panel protective layer PPL have been described in detail above with reference to FIG. 7, for convenience of explanation, further descriptions thereof will be omitted.

The impact absorbing layer ISL may be disposed on the electronic panel EP. The impact absorbing layer ISL may absorb an external impact applied from above the display device DD toward the electronic panel EP to protect the electronic panel EP. The impact absorbing layer ISL may be manufactured in the form of a stretched film.

The impact absorbing layer ISL may include a flexible plastic material. The flexible plastic material may be defined as a synthetic resin film. For example, the impact absorbing layer ISL may include the flexible plastic material such as polyimide (PI) and polyethylene terephthalate (PET).

The window WIN may be disposed on the impact absorbing layer ISL. The window WIN may protect the electronic panel EP from external scratches. The window WIN may have an optically transparent property. The window WIN may include glass. However, the window WIN is not limited thereto. For example, according to embodiments, the window WIN may include a synthetic resin film.

The window WIN may have a multilayer structure or a single-layer structure. For example, the window WIN may include a plurality of synthetic resin films bonded with an adhesive or may include a glass substrate and a synthetic resin film bonded with an adhesive.

The window protective layer WP may be disposed on the window WIN. The window protective layer WP may include a flexible plastic material such as, for example, polyimide and polyethylene terephthalate. The hard coating layer HC may be disposed on a top surface of the window protective layer WP.

A printed layer PIT may be disposed on a bottom surface of the window protective layer WP. The printed layer PIT may have a black color, but the color of the printed layer PIT is not limited thereto. The printed layer PIT may be disposed adjacent to an edge of the window protective layer WP.

The barrier layer BRL may be disposed on a lower portion of the panel protective layer PPL. The barrier layer BRL may be disposed between a first support plate PLT1 and the panel protective layer PPL. The barrier layer BRL may increase resistance to a compressive force caused by external pressing. The barrier layer BRL may serve to prevent deformation of the electronic panel EP. The barrier layer BRL may include a flexible plastic material such as, for example, polyimide and polyethylene terephthalate.

The barrier layer BRL may have a color that absorbs light. For example, the barrier layer BRL may have a black color. In this case, according to embodiments, when the display module DM is viewed from above the display module DM, components disposed on a lower portion of the barrier layer BRL are not visible to a user.

The first adhesive layer AL1 may be disposed between the window protective layer WP and the window WIN. The window protective layer WP and the window WIN may be bonded to each other by the first adhesive layer AL1. The first adhesive layer AL1 may cover the printed layer PIT.

The second adhesive layer AL2 may be disposed between the window WIN and the impact absorbing layer ISL. The window WIN and the impact absorbing layer ISL may be bonded to each other by the second adhesive layer AL2.

The third adhesive layer AL3 may be disposed between the impact absorbing layer ISL and the electronic panel EP. The impact absorbing layer ISL and the electronic panel EP may be bonded to each other by the third adhesive layer AL3.

The fourth adhesive layer AL4 may be disposed between the electronic panel EP and the panel protective layer PPL. The electronic panel EP and the panel protective layer PPL may be bonded to each other by the fourth adhesive layer AL4.

The fifth adhesive layer AL5 may be disposed between the panel protective layer PPL and the barrier layer BRL. The panel protective layer PPL and the barrier layer BRL may be bonded to each other by the fifth adhesive layer AL5.

The sixth adhesive layer AL6 may be disposed between the barrier layer BRL and the first support plate PLT1. The barrier layer BRL and the first support plate PLT1 may be bonded to each other by the sixth adhesive layer AL6.

Hereinafter, in this specification, "thickness" may indicate a value measured in the third direction DR3, and "width" may indicate a value measured in the first direction DR1 or the second direction DR2, which is a horizontal direction.

In an embodiment, the sixth adhesive layer AL6 may overlap the first and second non-folding areas NFA1 and NFA2, and does not overlap the folding area FA. That is, in an embodiment, the sixth adhesive layer AL6 is not disposed in the folding area FA. A width of an open portion of the sixth adhesive layer AL6 may be about 9.65 mm.

The first to sixth adhesive layers AL1 to AL6 may each include a transparent adhesive such as, for example, a pressure sensitive adhesive (PSA) and an optically clear adhesive (OCA. However, the type of the adhesive is not limited thereto.

A thickness of the panel protective layer PPL may be smaller than a thickness of the window protective layer WP, and a thickness of the barrier layer BRL may be smaller than the thickness of the panel protective layer PPL. A thickness of the electronic panel EP may be smaller than the thickness of the barrier layer BRL and may be about the same as a thickness of the window WIN. A thickness of the impact absorbing layer ISL may be smaller than the thickness of the electronic panel EP.

Exemplarily, the thickness of the window protective layer WP may be about 65 micrometers, and the thickness of the panel protective layer PPL may be about 50 micrometers. The thickness of the barrier layer BRL may be about 35 micrometers, and the thickness of each of the electronic panel EP and the window WIN may be about 30 micrometers. The thickness of the impact absorbing layer ISL may be about 23 micrometers.

A thickness of the first adhesive layer AL1 may be about the same as the thickness of the barrier layer BRL, and a thickness of each of the second and third adhesive layers AL2 and AL3 may be about the same as the thickness of the panel protective layer PPL. A thickness of the fourth adhesive layer AL4 may be about the same as a thickness of the fifth adhesive layer AL5.

The thickness of each of the fourth and fifth adhesive layers AL4 and AL5 may be smaller than the thickness of the electronic panel EP and greater than the thickness of the impact absorbing layer ISL. A thickness of the sixth adhesive layer AL6 may be smaller than the thickness of the impact absorbing layer ISL. A thickness of the hard coating layer HC may be smaller than the thickness of the sixth adhesive layer AL6.

Exemplarily, the thickness of the first adhesive layer AL1 may be about 35 micrometers, and the thickness of each of the second and third adhesive layers AL2 and AL3 may be about 50 micrometers. The thickness of each of the fourth and fifth adhesive layers AL4 and AL5 may be about 25 micrometers, and the thickness of the sixth adhesive layer AL6 may be about 16 micrometers. The thickness of the hard coating layer HC may be about 5 micrometers.

Widths of the electronic panel EP, the impact absorbing layer ISL, the panel protective layer PPL, and the third and fourth adhesive layers AL3 and AL4 may be about the same. In FIG. 10, the width of the electronic panel EP may be defined as a width of a portion of the electronic panel EP disposed in the first area AA1. Widths of the window protective layer WP and the first adhesive layer AL1 may be about the same. Widths of the barrier layer BRL and the fifth and sixth adhesive layers AL5 and AL6 may be about the same.

The widths of the electronic panel EP, the impact absorbing layer ISL, the panel protective layer PPL, and the third and fourth adhesive layers AL3 and AL4 may be greater than the widths of the window protective layer WP and the first adhesive layer AL1. Edges of the electronic panel EP, the impact absorbing layer ISL, the panel protective layer PPL, and the third and fourth adhesive layers AL3 and AL4 may be disposed more outward than the edge of the window protective layer WP and an edge of the first adhesive layer AL1.

Widths of the window WIN and the second adhesive layer AL2 may be smaller than the widths of the window protective layer WP and the first adhesive layer AL1. The width of the second adhesive layer AL2 may be smaller than the width of the window WIN. An edge of the window WIN may be disposed more inward than the edges of the window protective layer WP and the first adhesive layer AL1. An edge of the second adhesive layer AL2 may be disposed more inward than the edge of the window WIN.

The widths of the barrier layer BRL and the fifth and sixth adhesive layers AL5 and AL6 may be smaller than the widths of the window protective layer WP and the first adhesive layer AL1. Edges of the barrier layer BRL and the fifth and sixth adhesive layers AL5 and AL6 may be disposed more inward than the edges of the window protective layer WP and the first adhesive layer AL1.

Exemplarily, a distance between the edge of the electronic panel EP and the edge of the window protective layer WP may be about 10 micrometers. A distance between the edge of the electronic panel EP and the edge of the window WIN may be about 220 micrometers. A distance between the edge of the window WIN and the edge of the second adhesive layer AL2 may be about 190 micrometers.

The support part SUP may include the first support plate PLT1, a second support plate PLT2, a cover layer COV, a digitizer DGT, a shielding layer SHL, a heat dissipation layer RHL, seventh and eighth adhesive layers AL7 and AL8, and a plurality of first to fourth insulating tapes ITP1 to ITP4.

The first support plate PLT1 may be disposed on the lower portion of the electronic panel EP to support the electronic panel EP. The first support plate PLT1 may be more rigid than the display unit DSP. The first support plate PLT1 may include a non-metal material. For example, the first support plate PLT1 may include a reinforcing fiber composite material. The reinforcing fiber composite material may be a carbon fiber reinforced plastic (CFRP) or a glass fiber reinforced plastic (GFRP).

The first support plate PLT1 may include a reinforcing fiber composite material, resulting in a lightweight first support plate PLT1. By including the reinforcing fiber composite material, the first support plate PLT1 according to an embodiment may be more lightweight than a metal support plate using a metal material, and may have values of modulus and rigidity close to those of the metal support plate.

In addition, by including the reinforcing fiber composite material in the first support plate PLT1, the shape processing of the first support plate PLT1 may be more efficient than the shape processing of the metal support plate. For example, the first support plate PLT1 including the reinforcing fiber composite material may be more efficiently processed through a laser process or a micro-blast process.

A plurality of openings OP may be defined in a portion of the first support plate PLT1 overlapping the folding area FA. The openings OP may be formed by penetrating portions of the first support plate PLT1 in the third direction DR3. The openings OP may be formed through the aforementioned laser process or micro-blast process.

As the openings OP are defined in the portion of the first support plate PLT1 overlapping the folding area FA, the flexibility of the portion of the first support plate PLT1 overlapping the folding area FA may increase. As a result, the first support plate PLT1 may be easily folded about the folding area FA. A more detailed shape of the openings OP will be described in detail below.

A width of the portion in which the openings OP are formed may be smaller than the width of the open portion of the sixth adhesive layer AL6. For example, the width of the portion in which the openings OP are formed may be about 8.34 mm.

The cover layer COV may be disposed on a lower portion of the first support plate PLT1. The cover layer COV may cover the openings OP defined in the first support plate PLT1 by being disposed on the lower portion of the first support plate PLT1. In an embodiment, the cover layer COV may overlap the folding area FA and does not overlap the first and second non-folding areas NFA1 and NFA2. That is, in an embodiment, the cover layer COV is not disposed in the first and second non-folding areas NFA1 and NFA2. The cover layer COV may be in contact with a bottom surface of the portion of the first support plate PLT1 in which the openings OP are formed.

The cover layer COV may have a lower elastic modulus than the first support plate PLT1. For example, the cover layer COV may include thermoplastic polyurethane or rubber, but the material of the cover layer COV is not limited thereto. The cover layer COV may be manufactured in the form of a sheet to be attached to the first support plate PLT1. Exemplarily, a width of the cover layer COV may be about 10.65 mm.

The digitizer DGT may be disposed on the lower portion of the first support plate PLT1. The cover layer COV may be disposed between the first support plate PLT1 and the digitizer DGT. The cover layer COV may be spaced apart from a top surface of the digitizer DGT.

The digitizer DGT is a device capable of receiving information of a position indicated by a user on the display surface. The digitizer DGT may be implemented in an electromagnetic method (or an electromagnetic resonance method). For example, the digitizer DGT may include a digitizer sensor board including a plurality of coils. However, the digitizer DGT is not limited thereto, and may be implemented in an active electrostatic method.

When a user moves a pen on the display device DD, the pen may be driven by an AC signal so as to generate a vibrating magnetic field, and the vibrating magnetic field may induce a signal in the coils. A position of the pen may be detected through the signal induced in the coils. The digitizer DGT may detect the position of the pen by sensing an electromagnetic change generated by the approach of the pen.

In the case that the first support plate PLT1 disposed on the digitizer DGT and disposed adjacent to the digitizer DGT includes a metal, the sensitivity of the digitizer DGT may be lowered by the metal. For example, when a signal transmitted from on the display device DD is blocked due to signal interference by a metal support plate, the digitizer DGT may not operate normally. However, because the first support plate PLT1 disposed on the digitizer DGT includes the non-metal reinforcing fiber composite material in an embodiment of the inventive concept, the digitizer DGT may operate normally.

The digitizer DGT may be separated into two parts in the folding area FA. The parts of the digitizer DGT separated from each other may be connected to a digitizer driver through flexible circuit boards.

The shielding layer SHL may be disposed on a lower portion of the digitizer DGT. The shielding layer SHL may include a metal. For example, the shielding layer SHL may include copper, but the metal material of the shielding layer SHL is not limited thereto. The shielding layer SHL may be separated into two parts in the folding area FA. The parts of the shielding layer SHL separated from each other may be respectively disposed on lower portions of the parts of the digitizer DGT separated from each other.

The shielding layer SHL may shield the digitizer DGT from electromagnetic waves that may be applied from under the display device DD to the digitizer DGT. The shielding layer SHL may be defined as an electromagnetic shielding layer. The shielding layer SHL including a metal may serve as a heat dissipation layer.

The second support plate PLT2 may be disposed on a lower portion of the shielding layer SHL. The second support plate PLT2 may be more rigid than the display unit DSP. The second support plate PLT2 may include a metal material such as stainless steel (e.g., SUS 316), but the metal material of the second support plate PLT2 is not limited thereto. In addition, embodiments of the inventive concept are not limited thereto, and the second support plate PLT2 may include a non-metal material such as plastic.

The second support plate PLT2 may be separated into two parts in the folding area FA. For example, the second support plate PLT2 may include a (2_1)-th support plate PLT2_1 overlapping the first non-folding area NFA1 and a (2_2)-th support plate PLT2_2 overlapping the second non-folding area NFA2.

The (2_1)-th support plate PLT2_1 may support the first non-folding area NFA1. The (2_2)-th support plate PLT2_2 may support the second non-folding area NFA2. The (2_1)-th support plate PLT2_1 and the (2_2)-th support plate PLT2_2 may extend to the folding area FA and may be disposed adjacent to each other in the folding area FA.

The (2_1)-th support plate PLT2_1 and the (2_2)-th support plate PLT2_2 may be spaced apart from each other in a lower portion of the folding area FA. Exemplarily, a gap between the (2_1)-th support plate PLT2_1 and the (2_2)-th support plate PLT2_2 in a horizontal direction may be about 0.4 mm to about 2 mm.

The (2_1)-th support plate PLT2_1 and the (2_2)-th support plate PLT2_2 may support, in the lower portion of the folding area FA, the portion of the first support plate PLT1 in which the openings OP are defined. When pressure is applied from above to the first support plate PLT1, the (2_1)-th support plate PLT2_1 and the (2_2)-th support plate PLT2_2 may prevent deformation of the portion of the first support plate PLT1 in which the openings OP are defined. Additionally, the (2_1)-th and (2_2)-th support plates PLT2_1 and PLT2_2 may perform a heat dissipation function.

The heat dissipation layer RHL may be disposed on a lower portion of the second support plate PLT2. The heat dissipation layer RHL may be separated into two parts in the folding area FA. The parts of the heat dissipation layer RHL separated from each other may be respectively disposed on lower portions of the (2_1)-th and (2_2)-th support plates PLT2_1 and PLT2_2.

The heat dissipation layer RHL may perform a heat dissipation function. For example, the heat dissipation layer RHL may include graphite, but the material of the heat dissipation layer RHL is not limited thereto. As the heat dissipation layer RHL performs the heat dissipation function together with the second support plate PLT2 and the shielding layer SHL, the heat dissipation performance of the display device DD may be increased.

The first to fourth insulating tapes ITP1 to ITP4 may be disposed on lower portions of the digitizer DGT and the second support plate PLT2. The first to fourth insulating tapes ITP1 to ITP4 may each include an insulating material.

The two first insulating tapes ITP1 may be disposed adjacent to one side of the (2_1)-th support plate PLT2_1 and one side of the (2_2)-th support plate PLT2_2 facing each other, and may be respectively disposed on the lower portions of the (2_1)-th and (2_2)-th support plates PLT2_1 and PLT2_2.

The second insulating tape ITP2 and the third insulating tape ITP3 may be respectively disposed adjacent to both sides of the digitizer DGT and may be disposed on the lower portion of the digitizer DGT. The second insulating tape ITP2 may be disposed adjacent to an edge of the (2_1)-th support plate PLT2_1, and the third insulating tape ITP3 may be disposed adjacent to an edge of the (2_2)-th support plate PLT2_2.

The fourth insulating tape ITP4 may be disposed adjacent to the other side of the (2_2)-th support plate PLT2_2 opposite to the one side of the (2_2)-th support plate PLT2_2. The fourth insulating tape ITP4 may be disposed on the lower portion of the (2_2)-th support plate PLT2_2.

The shielding layer SHL, the second support plate PLT2, the heat dissipation layer RHL, the first insulating tapes ITP1, and the fourth insulating tape ITP4 may be disposed between the second insulating tape ITP2 and the third insulating tape ITP3. One of the two parts of the heat dissipation layer RHL separated from each other may be disposed between one of the first insulating tapes ITP1 and the fourth insulating tape ITP4 that are disposed on the lower portion of the (2_2)-th support plate PLT2_2. The other of the two parts of the heat dissipation layer RHL separated from each other may be disposed between the other of the first insulating tapes ITP1 disposed on the lower portion of the (2_1)-th support plate PLT2_1 and the second insulating tape ITP2 disposed on the lower portion of the digitizer DGT.

In an embodiment, magnets may be disposed on a lower portion of the display module DM to maintain a folded state of the electronic device ED when the electronic device ED is folded. The magnets may be disposed adjacent to the edge of the electronic device ED. The folded state of the electronic device ED may be maintained by the magnetic force of the magnets.

When magnetic properties of the magnets are transmitted to the digitizer DGT, the digitizer DGT may not operate normally. For example, the first to fourth insulating tapes ITP1 to ITP4 may block the magnetic properties of the magnets disposed at the edge of the electronic device ED from being transmitted to the digitizer DGT. The first to fourth insulating tapes ITP1 to ITP4 may be defined as magnetic shielding tapes.

The seventh adhesive layer AL7 may be disposed between the first support plate PLT1 and the digitizer DGT. The first support plate PLT1 and the digitizer DGT may be bonded to each other by the seventh adhesive layer AL7. In an embodiment, the seventh adhesive layer AL7 is not disposed in the folding area FA. That is, the seventh adhesive layer AL7 may have an opening in the folding area FA. The aforementioned cover layer COV may be disposed in the opening of the seventh adhesive layer AL7. As the seventh adhesive layer AL7 is not disposed in the lower portion of the folding area FA, a folding operation of the support part SUP may be more easily performed.

The eighth adhesive layer AL8 may be disposed between the shielding layer SHL and the second support plate PLT2. The shielding layer SHL and the second support plate PLT2 may be bonded to each other by the eighth adhesive layer AL8. The eighth adhesive layer AL8 may be separated into parts in the folding area FA. The parts of the eighth adhesive layer AL8 separated from each other may be respectively disposed between the parts of the shielding layer SHL separated from each other and the (2_1)-th and (2_2)-th support plates PLT2_1 and PLT2_2. The eighth adhesive layer AL8 may be disposed between the second insulating tape ITP2 and the third insulating tape ITP3.

A width of the first support plate PLT1 may be substantially the same as the width of the electronic panel EP. Widths of the digitizer DGT and the seventh adhesive layer AL7 may be smaller than the width of the first support plate PLT1. Edges of the digitizer DGT and the seventh adhesive layer AL7 may be disposed more inward than an edge of the first support plate PLT1.

Widths of the shielding layer SHL, the eighth adhesive layer AL8, and the second support plate PLT2 may be smaller than the width of the digitizer DGT. Edges of the shielding layer SHL, the eighth adhesive layer AL8, and the second support plate PLT2 may be disposed more inward than the edge of the digitizer DGT.

A thickness of the first support plate PLT1 may be greater than a thickness of the digitizer DGT, and the thickness of the digitizer DGT may be greater than a thickness of the second support plate PLT2. The thickness of the second support plate PLT2 may be greater than a thickness of the heat dissipation layer RHL, and the thickness of the heat dissipation layer RHL may be greater than a thickness of each of the seventh and eighth adhesive layers AL7 and AL8.

The thickness of each of the seventh and eighth adhesive layers AL7 and AL8 may be greater than a thickness of the shielding layer SHL, and the thickness of the shielding layer SHL may be greater than a thickness of the cover layer COV. The thickness of the cover layer COV may be about the same as the thickness of the sixth adhesive layer AL6.

Exemplarily, the thickness of the first support plate PLT1 may be about 170 micrometers, the thickness of the digitizer DGT may be about 123.5 micrometers, and the thickness of the second support plate PLT2 may be about 50 micrometers. The thickness of the shielding layer SHL may be about 17 micrometers, and the thickness of the heat dissipation layer RHL may be about 27 micrometers. The thickness of each of the seventh and eighth adhesive layers AL7 and AL8 may be about 20 micrometers, and the thickness of the cover layer COV may be about 16 micrometers.

A thickness of each of the first insulating tapes ITP1 may be smaller than the thickness of the first support plate PLT1 and greater than the thickness of the digitizer DGT. A thickness of the third insulating tape ITP3 may be greater than the thickness of the first support plate PLT1. A thickness of the fourth insulating tape ITP4 may be smaller than the thickness of each of the first insulating tapes ITP1. A thickness of the second insulating tape ITP2 may be smaller than the thickness of the fourth insulating tape ITP4.

Exemplarily, the thickness of each of the first insulating tapes ITP1 may be about 145 micrometers, the thickness of the second insulating tape ITP2 may be about 87 micrometers, the thickness of the third insulating tape ITP3 may be about 207 micrometers, and the thickness of the fourth insulating tape ITP4 may be about 90 micrometers.

The seventh and eighth adhesive layers AL7 and AL8 may each include a pressure sensitive adhesive (PSA) or an optically clear adhesive (OCA), but the type of the adhesive is not limited thereto.

The barrier layer BRL, the cover layer COV, the digitizer DGT, the shielding layer SHL, the heat dissipation layer RHL, and the plurality of first to fourth insulating tapes ITP1 to ITP4 may be defined as a functional layer. The barrier layer BRL disposed between the electronic panel EP and the first support plate PLT1 may be defined as a first functional layer. The cover layer COV, the digitizer DGT, the shielding layer SHL, the heat dissipation layer RHL, and the first to fourth insulating tapes ITP1 to ITP4 disposed on the lower portion of the first support plate PLT1 may be defined as a second functional layer.

First, second, and third holes H1, H2, and H3 may be defined in a portion of the display module DM overlapping the first transmissive area TA1. The first, second, and third holes H1, H2, and H3 may be disposed on the lower portion of the panel protective layer PPL.

The first hole H1 may be defined in the first support plate PLT1. The second hole H2 may be integrally defined in the barrier layer BRL and the fifth and sixth adhesive layers AL5 and AL6. The third hole H3 may be integrally defined in the digitizer DGT, the shielding layer SHL, the second support plate PLT2, the heat dissipation layer RHL, and the seventh and eighth adhesive layers AL7 and AL8.

The second hole H2 may be disposed on the first hole H1, and the third hole H3 may be disposed on a lower portion of the first hole H1. The first, second, and third holes H1, H2, and H3 may be continuously defined in the display module DM. The first, second, and third holes H1, H2, and H3 may be defined as a camera hole. The aforementioned camera CA may be disposed in the first, second, and third holes H1, H2, and H3.

In an embodiment, first, second, and third sensor holes having the same structure as the first, second, and third holes H1, H2, and H3 may be defined in a portion of the display module DM overlapping the second transmissive area TA2. The above-described sensor SN may be disposed in the first, second, and third sensor holes.

Referring to FIG. 11, in an embodiment, the panel protective layer PPL and the fourth adhesive layer AL4 are not disposed on a lower portion of the bending area BA. The panel protective layer PPL and the fourth adhesive layer AL4 may be disposed on a lower portion of the second area AA2 of the electronic panel EP. The data driver DDV may be disposed on the second area AA2 of the electronic panel EP.

A printed circuit board PCB may be connected to the second area AA2 of the electronic panel EP. The printed circuit board PCB may be connected to one side of the second area AA2. The bending area BA may be bent, so that the second area AA2 may be disposed under the first area AA1. Accordingly, the data driver DDV and the printed circuit board PCB may be disposed under the first area AA1.

Figure 12:
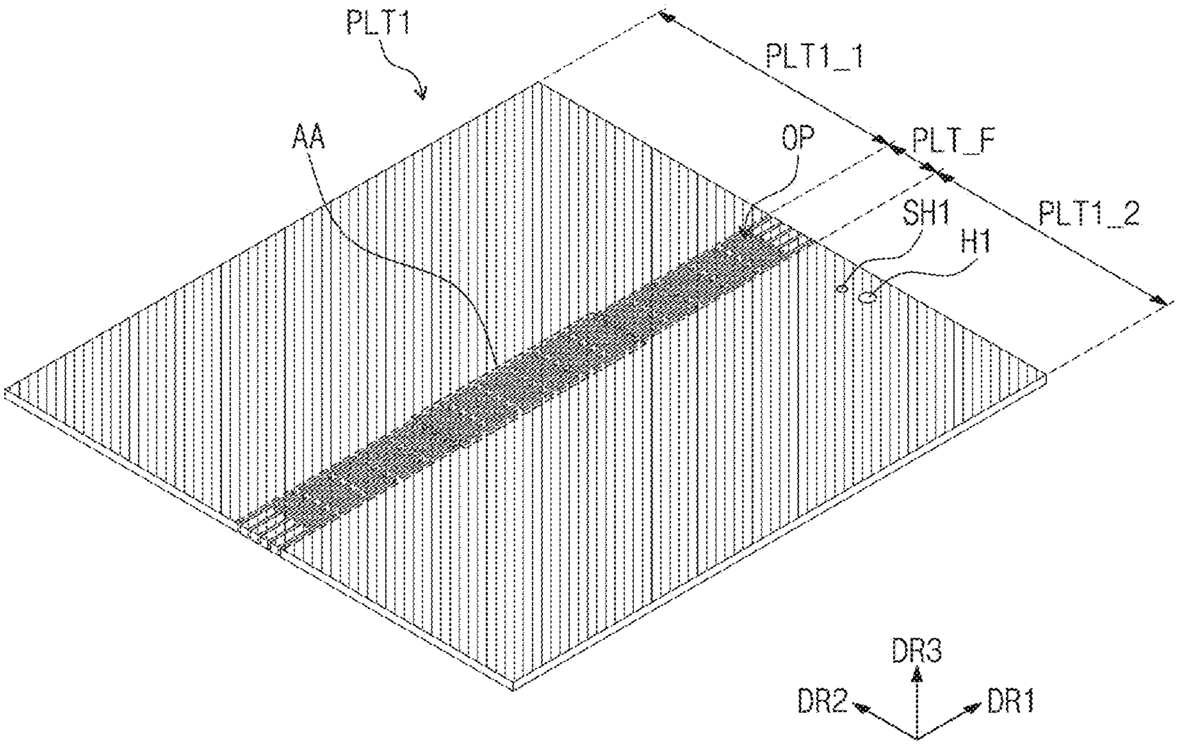
FIG. 12 is a perspective view of the first support plate illustrated in FIG. 10 according to an embodiment of the inventive concept.

FIG. 12 is a perspective view of the first support plate illustrated in FIG. 10 according to an embodiment of the inventive concept.

Referring to FIG. 12, the first support plate PLT1 may include a (1_1)-th plate PLT1_1, a (1_2)-th plate PLT1_2, and a folding plate PLT_F. The folding plate PLT_F may be disposed between the (1_1)-th plate PLT1_1 and the (1_2)-th plate PLT1_2. The (1_1)-th plate PLT1_1 and the (1_2)-th plate PLT1_2 may respectively overlap the first non-folding area NFA1 and the second non-folding area NFA2 illustrated in FIG. 10. The folding plate PLT_F may overlap the folding area FA illustrated in FIG. 10.

A grid pattern may be defined in the folding plate PLT_F. For example, the plurality of openings OP may be defined in the folding plate PLT_F. The openings OP may be arranged according to a predetermined rule. The openings OP may be arranged in a grid shape to form the grid pattern in the folding plate PLT_F.

As the openings OP are defined in the folding plate PLT_F, a surface area of the folding plate PLT_F may be reduced, and thus, the rigidity of the folding plate PLT_F may be lowered. Accordingly, the flexibility of the folding plate PLT_F may be higher when the openings OP are defined in the folding plate PLT_F than when the openings OP are not defined in the folding plate PLT_F. As a result, the folding plate PLT_F may be folded more easily.

The above-described first hole H1 may be defined in the (1_2)-th plate PLT1_2. A first sensor hole SH1 may be defined in the (1_2)-th plate PLT1_2. The first hole H1 and the first sensor hole SH1 may be disposed adjacent to an edge of the (1_2)-th plate PLT1_2.

Figure 13:
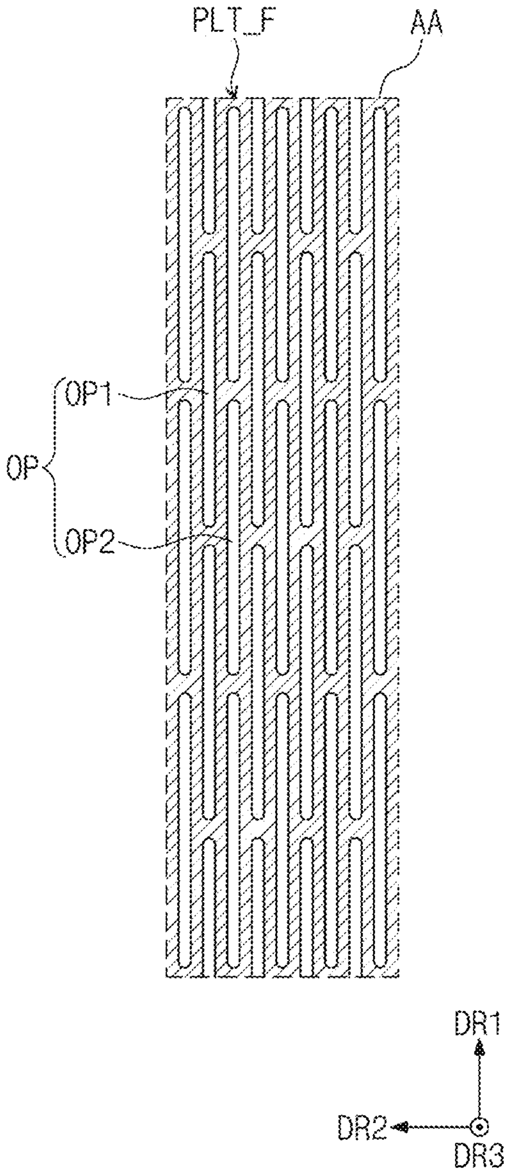
FIG. 13 is an enlarged plan view of the area AA illustrated in FIG. 12 according to an embodiment of the inventive concept.

FIG. 13 is an enlarged plan view of the area AA illustrated in FIG. 12 according to an embodiment of the inventive concept.

Referring to FIG. 13, the openings OP may be arranged in the first direction DR1 and the second direction DR2. The openings OP may each extend longer in the first direction DR1 than in the second direction DR2. The openings OP may extend in a direction substantially parallel to the aforementioned folding axis FX.

The openings OP may include a plurality of first openings OP1 arranged in the first direction DR1 and a plurality of second openings OP2 disposed adjacent to the first openings OP1 in the second direction DR2 and arranged in the first direction DR1. The first openings OP1 and the second openings OP2 may be disposed in a non-aligned manner.

Figure 14:
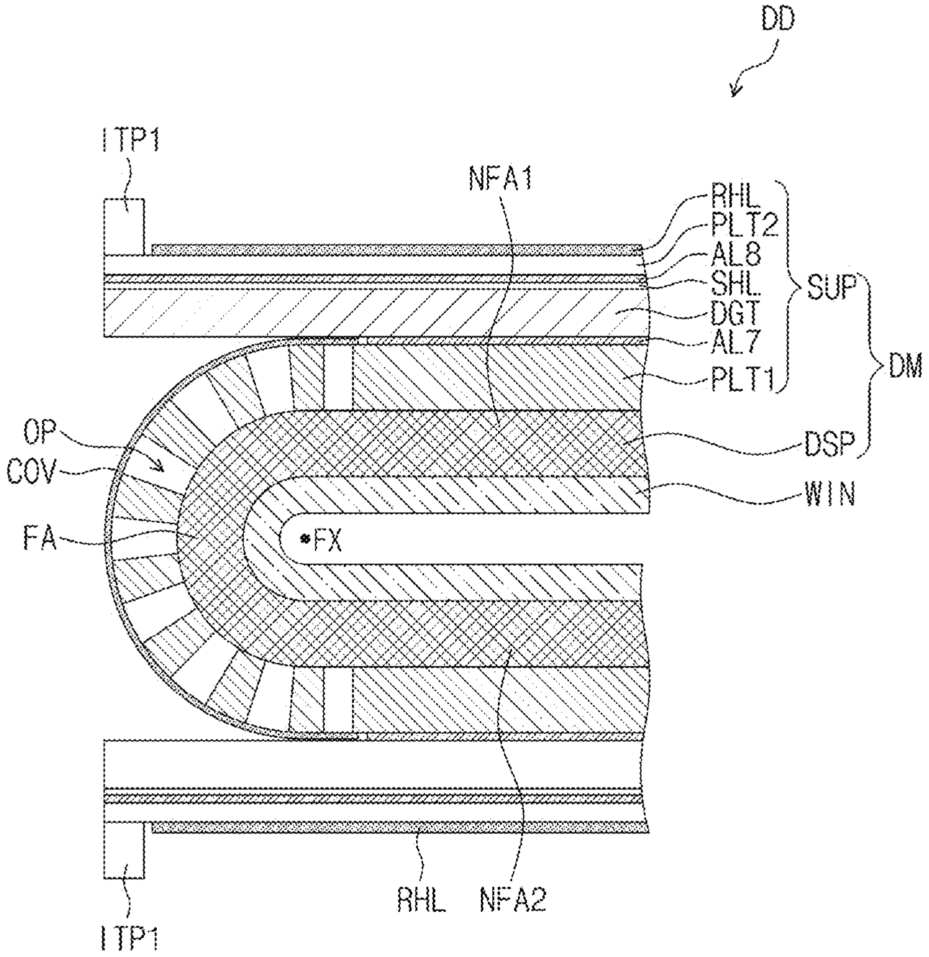
FIG. 14 exemplarily illustrates a folded state of the display device illustrated in FIG. 10 according to an embodiment of the inventive concept.

FIG. 14 exemplarily illustrates a folded state of the display device illustrated in FIG. 10 according to an embodiment of the inventive concept.

For convenience of illustration, the bending area BA and the second area AA2 of the electronic panel EP illustrated in FIG. 10 are omitted in FIG. 14. In addition, each of the display unit DSP and the window module WM is illustrated as a single layer.

Referring to FIG. 14, the display device DD may be in-folded around the folding axis FX. The folding area FA is bent, so that the first non-folding area NFA1 and the second non-folding area NFA2 may face each other. The state of the display device DD may change from a first state in which, as illustrated in FIG. 10, the display device DD is flat to a second state in which, as illustrated in FIG. 14, the display device DD is folded, or may change from the second state to the first state. This folding operation may be repeatedly performed.

Because the display module DM is a flexible display module, the folding area FA of the display module DM may be easily bent. The plurality of openings OP overlapping the folding area FA may be defined in the first support plate PLT1. Accordingly, during the folding operation, the portion of the first support plate PLT1 overlapping the folding area FA may be easily bent as a result of the openings OP.

The cover layer COV may be in contact with the first support plate PLT1 without being in contact with the digitizer DGT. When the display device DD is folded, the parts of the digitizer DGT separated from each other may be spaced apart and may move away from each other. In the case in which the cover layer COV is attached to the first support plate PLT1 and the digitizer DGT, the parts of the digitizer DGT separated from each other may not be spaced apart and may not move away from each other due to the adhesive force between the digitizer DGT and the cover layer COV when the display device DD is folded. Accordingly, the folding operation of the digitizer DGT may be difficult.

In an embodiment of the inventive concept, the cover layer COV is not attached to the digitizer DGT and is attached only to the first support plate PLT1, so that the display device DD may be easily folded.

Figure 15:
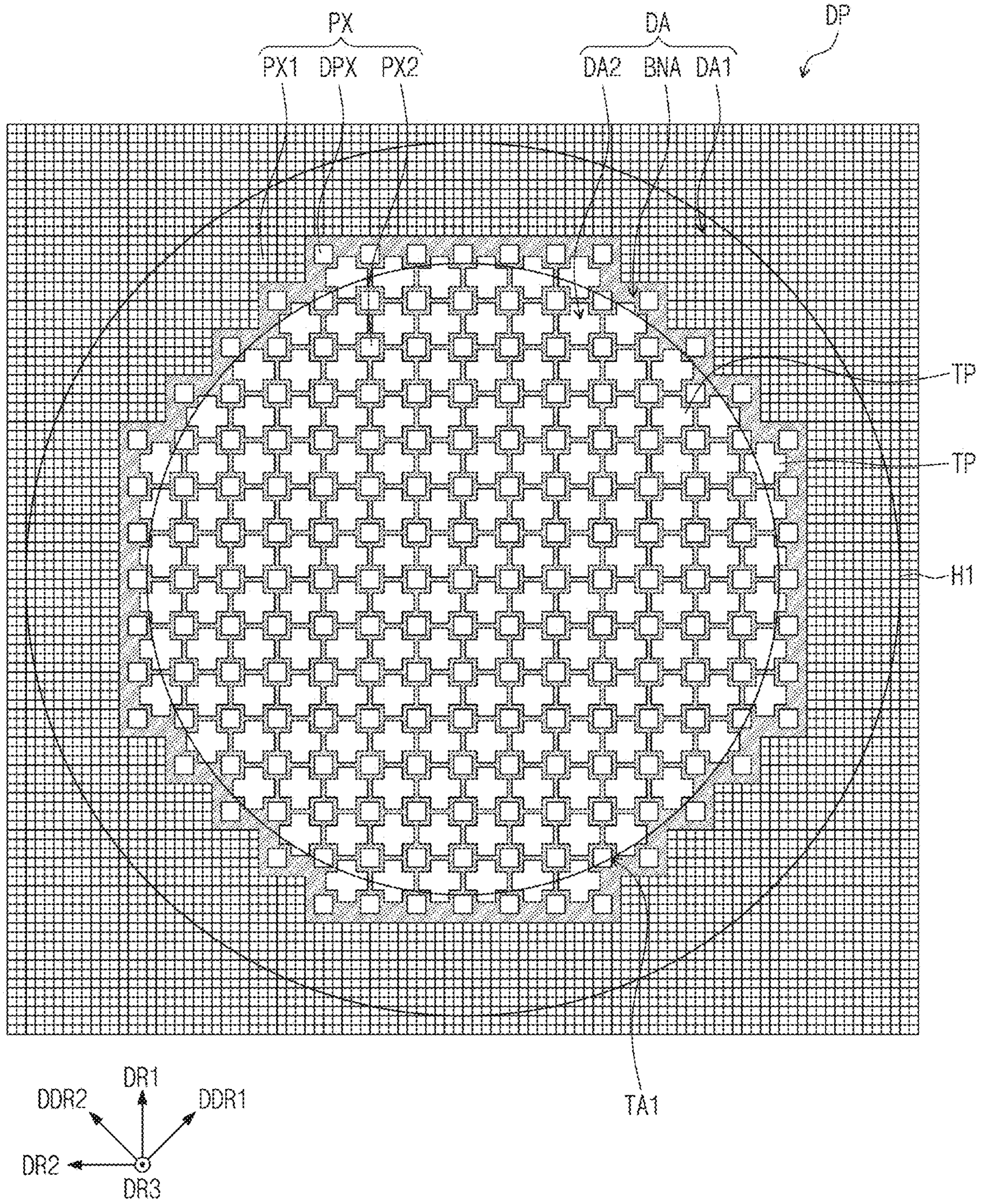
FIG. 15 is an enlarged plan view of the first transmissive area illustrated in FIG. 10 according to an embodiment of the inventive concept.

FIG. 15 is an enlarged plan view of the first transmissive area illustrated in FIG. 10 according to an embodiment of the inventive concept.

Exemplarily, although a planar configuration of the first transmissive area TA1 is illustrated, a planar configuration of the second transmissive area TA2 may be substantially the same as that of the first transmissive area TA1. Exemplarily, the first hole H1 is illustrated in FIG. 15 together with the first transmissive area TA1.

Referring to FIG. 15, the display area DA may include a first display area DA1, a second display area DA2 disposed adjacent to the first display area DA1, and a boundary area BNA between the first display area DA1 and the second display area DA2.

The second display area DA2 may overlap the first transmissive area TA1. The second display area DA2 is substantially defined by the first transmissive area TA1, and thus, may be defined as an area the same as the first transmissive area TA1. The first display area DA1 may surround the second display area DA2. The second display area DA2 may have a higher light transmittance than the first display area DAL The pixels PX may include a plurality of first pixels PX1, a plurality of second pixels PX2, and a plurality of dummy pixels DPX. The first pixels PX1 may be disposed in the first display area DA1. The second pixels PX2 may be disposed in the second display area DA2. The dummy pixels DPX may be disposed in the boundary area BNA. Exemplarily, the boundary area BNA disposed adjacent to the first display area DA1 may have a shape similar to an octagon. However, the shape of the boundary area BNA is not limited thereto.

Exemplarily, the second pixels PX2 may be arranged in the first direction DR1 and the second direction DR2 in the second display area DA2, but the arrangement of the second pixels PX2 is not limited thereto. The dummy pixels DPX may surround the second display area DA2 along the boundary area BNA. Each of the second pixels PX2 and the dummy pixels DPX may include a plurality of sub-pixels that display red, green, and blue colors. The structures of the first pixels PX1 and the sub-pixels may substantially have the structure illustrated in FIG. 9.

The second display area DA2 may display an image using the second pixels PX2. The first display area DA1 may display an image using the first pixels PX1. The boundary area BNA may display an image using the dummy pixels DPX. Accordingly, a predetermined image may be displayed in the display area DA by light generated in the first pixels PX1, the second pixels PX2, and the dummy pixels DPX.

The display panel DP may include a plurality of transmissive portions TP disposed in the second display area DA2. In an embodiment, the transmissive portions TP are not disposed in the first display area DA1. The transmissive portions TP may be disposed between the second pixels PX2. The transmissive portions TP may be disposed between the dummy pixels DPX and some of the second pixels PX2 disposed adjacent to the dummy pixels DPX.

Each of the transmissive portions TP may exemplarily have a cross shape, but the shape of the transmissive portion TP is not limited thereto. The transmissive portions TP may be disposed around each of the second pixels PX2. The transmissive portions TP may be disposed in a first diagonal direction DDR1 and a second diagonal direction DDR2 with respect to each of the second pixels PX2.

The first diagonal direction DDR1 may be defined as a direction crossing the first and second directions DR1 and DR2 on a plane defined by the first and second directions DR1 and DR2. The second diagonal direction DDR2 may be defined as a direction crossing the first diagonal direction DDR1 on the plane defined by the first and second directions DR1 and DR2. Exemplarily, the first and second directions DR1 and DR2 may cross each other substantially perpendicularly, and the first and second diagonal directions DDR1 and DDR2 may cross each other substantially perpendicularly.

The transmissive portions TP may have higher light transmittance than the first and second pixels PX1 and PX2 and the dummy pixels DPX. The light (the above-described optical signal) passing through the transmissive portions TP may be provided to the camera CA disposed under the second display area DA2. The light transmittance of the first transmissive area TA1 may be increased by the transmissive portions TP, and light may be provided to the camera CA through the first transmissive area TA1. Accordingly, the second display area DA2 may display an image, and additionally, light passing through the second display area DA2 may be provided to the camera CA to allow an image to be captured.

In an embodiment, a portion of the display panel DP overlapping the second transmissive area TA2 may have substantially the same configuration as the second display area DA2 illustrated in FIG. 15.

An edge of the first hole H1 may surround the second pixels PX2, the dummy pixels DPX, and the transmissive portions TP. The edge of the first hole H1 may be disposed more outward than the boundary area BNA.

Figure 16:
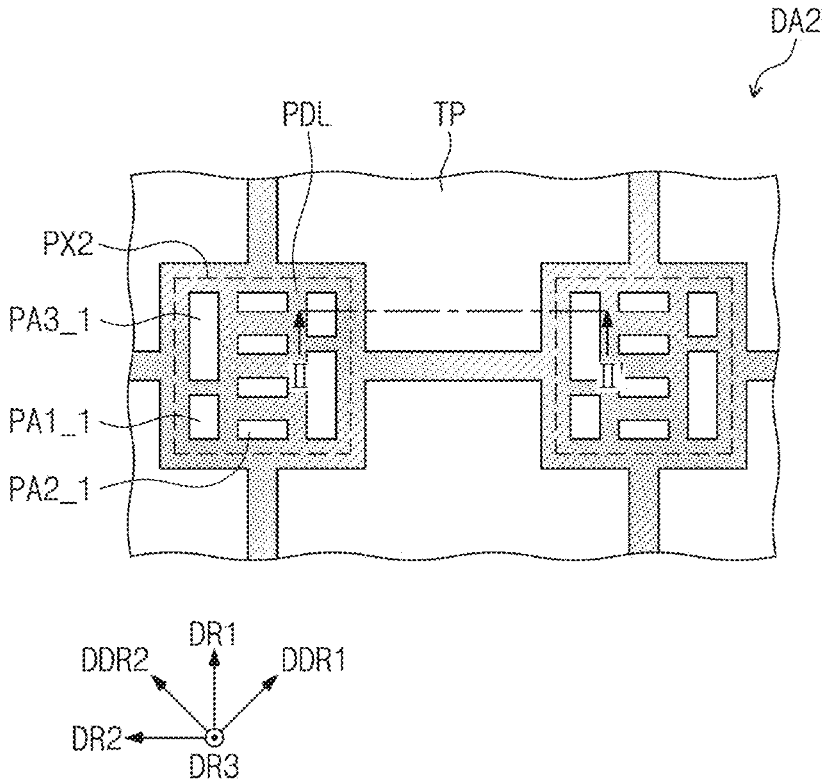
FIG. 16 illustrates a planar configuration of the second pixels illustrated in FIG. 15 according to an embodiment of the inventive concept.

FIG. 16 illustrates a planar configuration of the second pixels illustrated in FIG. 15 according to embodiments of the inventive concept.

Two second pixels PX2 disposed adjacent to each other in the second direction DR2 are exemplarily illustrated in FIG. 16. In an embodiment, the dummy pixels DPX may have the same configuration as the second pixels PX2 illustrated in FIG. 16.

Referring to FIG. 16, the second display area DA2 may include a plurality of light emitting areas PA1_1, PA2_1, and PA3_1 capable of displaying a plurality of colors. The light emitting areas PAU, PA2_1, and PA3_1 may include a plurality of first light emitting areas PA1_1, a plurality of second light emitting areas PA2_1, and a plurality of third light emitting areas PA3_1.

Exemplarily, two first light emitting areas PA1_1, four second light emitting areas PA2_1, and two third light emitting areas PA3_1 are illustrated in each of the second pixels PX2. However, the number of each of the first, second, and third light emitting areas PAU, PA2_1, and PA3_1 disposed in each of the second pixels PX2 is not limited thereto.

Exemplarily, the first light emitting areas PA1_1 may display red, the second light emitting areas PA2_1 may display green, and the third light emitting areas PA3_1 may display blue. However, the colors displayed by the first, second, and third light emitting areas PA1_1, PA2_1, and PA3_1 are not limited thereto.

Each of the first, second, and third light emitting areas PA1_1, PA2_1, and PA3_1 may exemplarily have a rectangular shape, but the shape of each of the first, second, and third light emitting areas PAU, PA2_1, and PA3_1 is not limited thereto.

The first, second, and third light emitting areas PA1_1, PA2_1, and PA3_1 may be partitioned by the pixel defining film PDL. In addition, in an embodiment, the pixel defining film PDL is not disposed in the transmissive portions TP.

The first light emitting areas PA1_1 and the third light emitting areas PA3_1 may each extend in the first direction DR1. One pair of first and third light emitting areas PA1_1 and PA3_1 among the first and third light emitting areas PA1_1 and PA3_1 may be arranged in the order of the third light emitting area PA3_1 and the first light emitting area PA1_1. The other pair of first and third light emitting areas PA1_1 and PA3_1 among the first and third light emitting areas PA1_1 and PA3_1 may be arranged in the order of the first light emitting area PA1_1 and the third light emitting area PA3_1. The one pair of the first and third light emitting areas PA1_1 and PA3_1 and the other pair of the first and third light emitting areas PA1_1 and PA3_1 may be spaced apart from each other in the second direction DR2.

The second light emitting areas PA2_1 may each extend in the second direction DR2 and may be arranged in the first direction DR1. The second light emitting areas PA2_1 may be disposed between the one pair of the first and third light emitting areas PA1_1 and PA3_1 and the other pair of the first and third light emitting areas PA1_1 and PA3_1.

Figure 17:
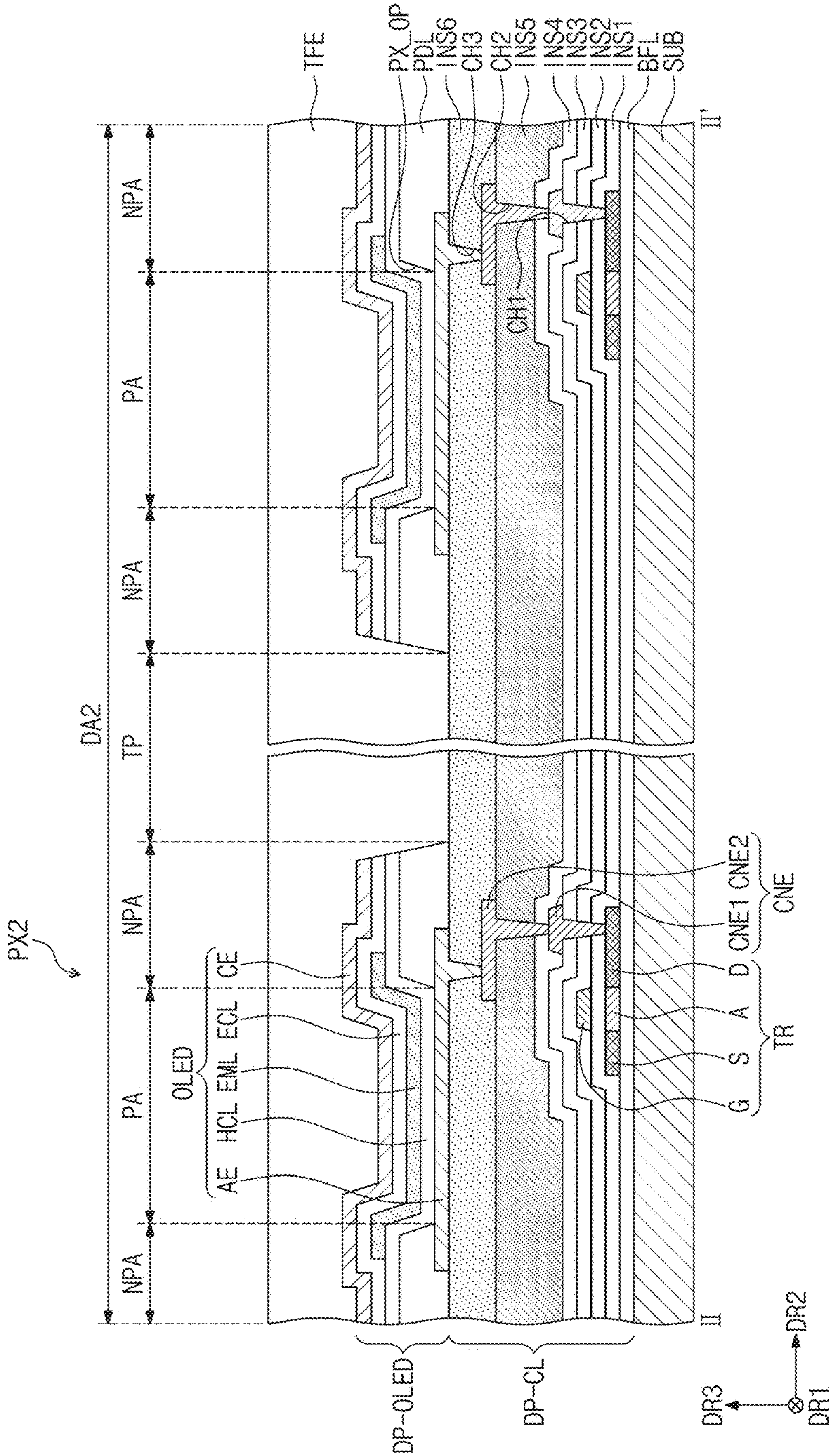
FIG. 17 is a cross-sectional view taken along line II-IP illustrated in FIG. 16 according to an embodiment of the inventive concept.

FIG. 17 is a cross-sectional view taken along line II-IP illustrated in FIG. 16 according to an embodiment of the inventive concept.

Referring to FIG. 17, the configuration of each of the second pixels PX2 is substantially the same as the configuration of the pixel PX illustrated in FIG. 9. Thus, for convenience of explanation, a description thereof will be omitted. The thin film encapsulation layer TFE is exemplarily illustrated as a single layer in FIG. 17.

In an embodiment, the light emitting element OLED is not disposed in the transmissive portion TP. The thin film encapsulation layer TFE may be disposed on the sixth insulating layer INS6 in the transmissive portion TP. Because the light emitting element OLED is not disposed in the transmissive portion TP, the light transmittance of the transmissive portion TP may be increased.

Referring to FIGS. 15, 16, and 17, the transmissive portions TP are disposed in the second display area DA2 and are not disposed in the first display area DA1, and thus, the first display area DA1 and the second display area DA2 may have different physical properties.

Figure 18:
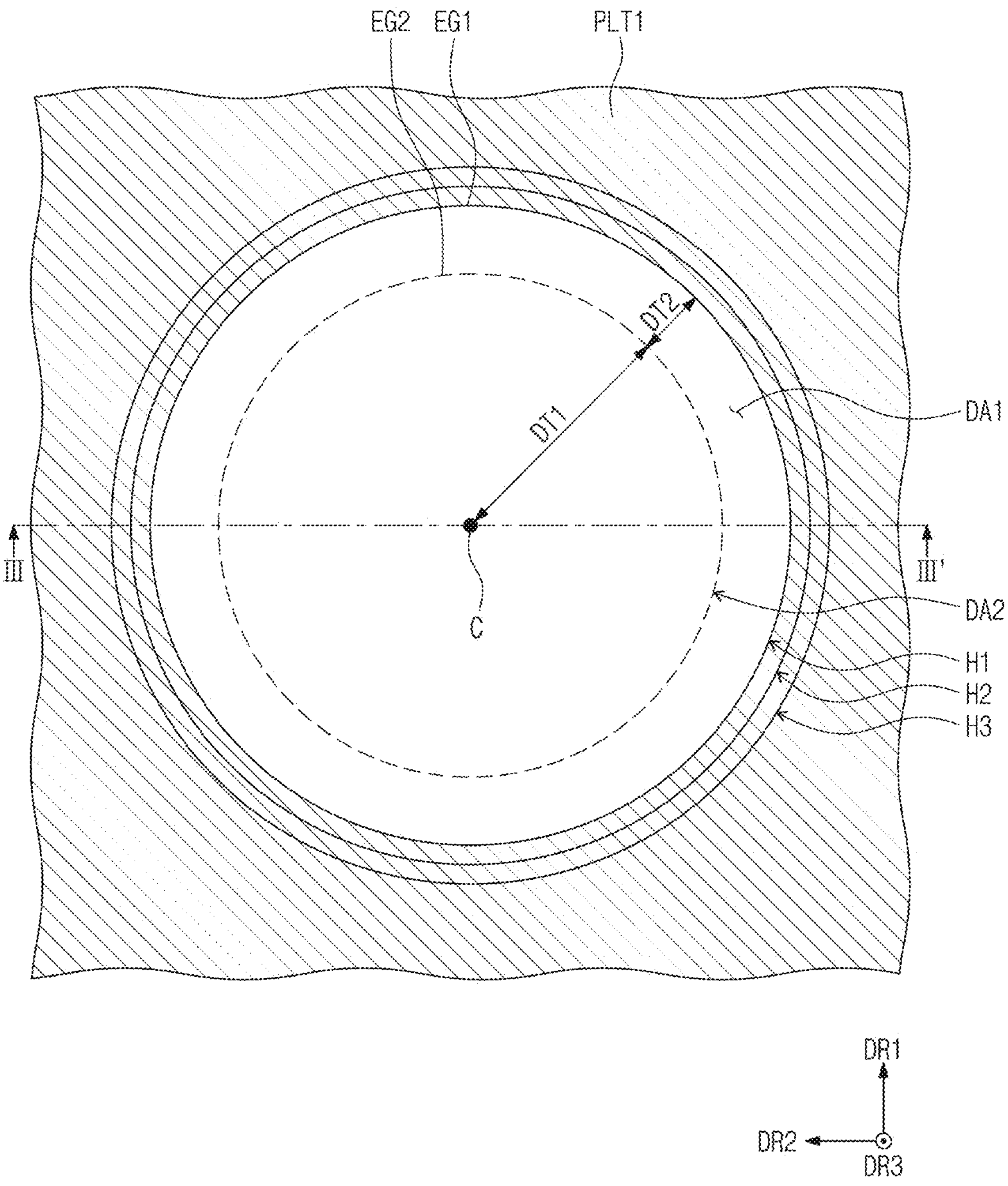
FIG. 18 is a schematic plan view illustrating the first, second, and third holes illustrated in FIG. 10 and the second display area illustrated in FIG. 15 according to an embodiment of the inventive concept.
Figure 19:
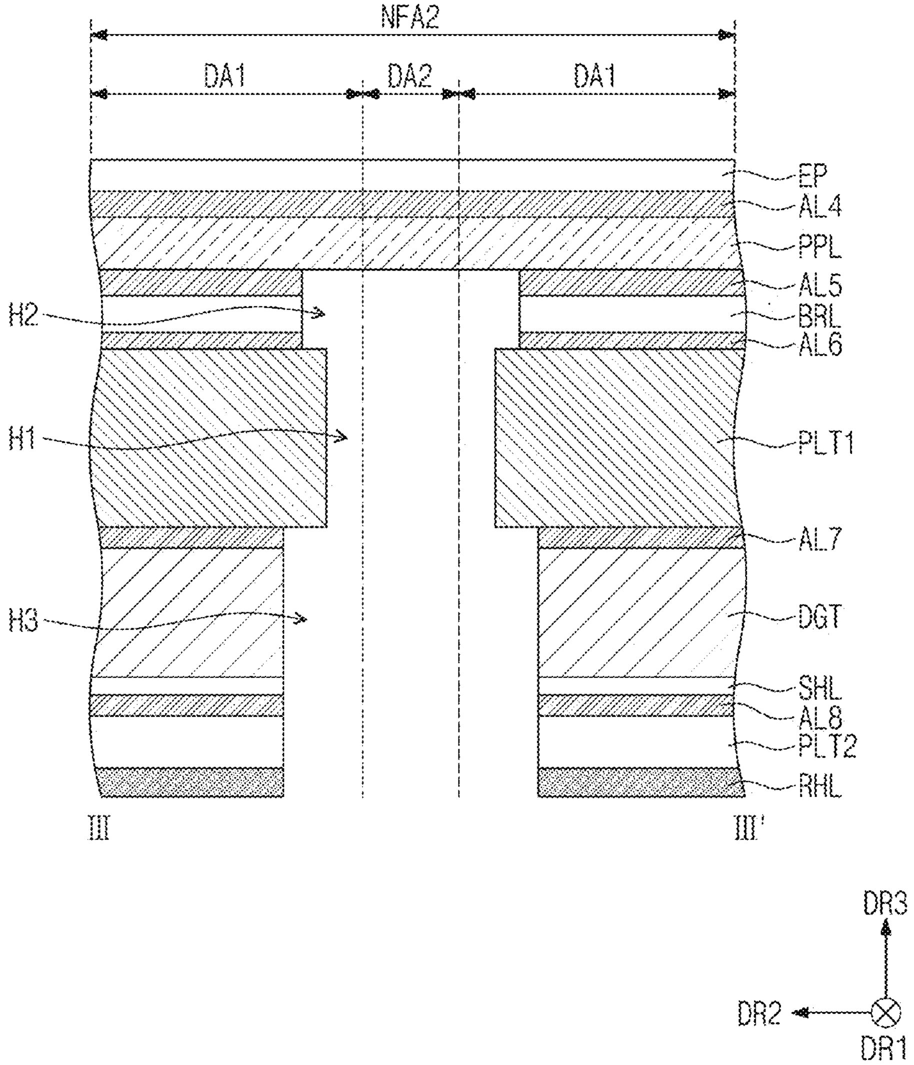
FIG. 19 is a cross-sectional view taken along line III-III' illustrated in FIG. 18 according to an embodiment of the inventive concept.

FIG. 18 is a schematic plan view illustrating the first, second, and third holes illustrated in FIG. 10 and the second display area illustrated in FIG. 15. FIG. 19 is a cross-sectional view taken along line III-III' illustrated in FIG. 18.

Exemplarily, the second display area DA2 is illustrated with a dotted line in FIG. 18, and the components on the electronic panel EP are omitted in FIG. 19.

Referring to FIG. 18 and FIG. 19, the first hole H1 overlapping the second display area DA2 may be defined in the first support plate PLT1. The second hole H2 overlapping the second display area DA2 may be defined in the barrier layer BRL and the fifth and sixth adhesive layers AL5 and AL6. The third hole H3 overlapping the second display area DA2 may be defined in the digitizer DGT, the shielding layer SHL, the second support plate PLT2, the heat dissipation layer RHL, and the seventh and eighth adhesive layers AL7 and AL8.

In a plan view, a size of each of the first, second, and third holes H1, H2, and H3 may be defined as a surface area of each of the first, second, and third holes H1, H2, and H3 or a diameter of each of the first, second, and third holes H1, H2, and H3.

In a plan view, each of the first, second, and third holes H1, H2, and H3 and the second display area DA2 may have a circular shape. In a plan view, the size of the first hole H1 may be larger than a size of the second display area DA2. In a plan view, a first edge EG1 of the first hole H1 may be disposed more outward than a second edge EG2 of the second display area DA2. The first edge EG1 may surround the second edge EG2.

A distance between a center point C of the second display area DA2 and the second edge EG2 may be defined as a first distance DT1. The first distance DT1 may be defined as a radius of the second display area DA2. A distance between the first edge EG1 and the second edge EG2 may be defined as a second distance DT2. A value obtained by adding the first distance DT1 to the second distance DT2 may be defined as a radius of the first hole H1.

The first distance DT1 may be exemplarily about 3.5 mm. The second distance DT2 may be set to about 0.2 to about 0.7 times the first distance DT1. The radius of the first hole H1 may be exemplarily about 4.5 mm.

In a plan view, the size of the second hole H2 may be larger than the size of the second display area DA2. An edge of the second hole H2 may be disposed more outward than the second edge EG2 of the second display area DA2.

In a plan view, the size of the third hole H3 may be larger than the size of the second display area DA2. An edge of the third hole H3 may be disposed more outward than the second edge EG2 of the second display area DA2.

In a plan view, the first hole H1 may have a size different from that of each of the second hole H2 and the third hole H3. For example, the size of each of the second hole H2 and the third hole H3 may be larger than the size of the first hole H1. The edge of each of the second hole H2 and the third hole H3 may be disposed more outward than the first edge EG1 of the first hole H1.

In a plan view, the second hole H2 may have a size different from that of the third hole H3. For example, the size of the third hole H3 may be larger than the size of the second hole H2. The edge of the third hole H3 may be disposed more outward than the edge of the second hole H2. Exemplarily, a radius of the second hole H2 may be about 4.7 mm, and a radius of the third hole H3 may be about 5 mm.

In an embodiment, the first, second, and third sensor holes defined in the portion of the display module DM overlapping the second transmissive area TA2 may have a structure substantially similar to that of the first, second, and third holes H1, H2, and H3.

FIGS. 20 to 27 illustrate various embodiments of first, second, and third holes of the inventive concept.

Exemplarily, FIGS. 20 to 27 illustrate cross-sections corresponding to FIG. 19. Hereinafter, components illustrated in FIGS. 20 to 27 will be described mainly focusing on differences in structure between FIG. 19 and FIGS. 20 to 27. The same components are denoted by the same reference numerals, and for convenience of explanation, a further description of components and technical aspects previously described may be omitted.

Figure 20:
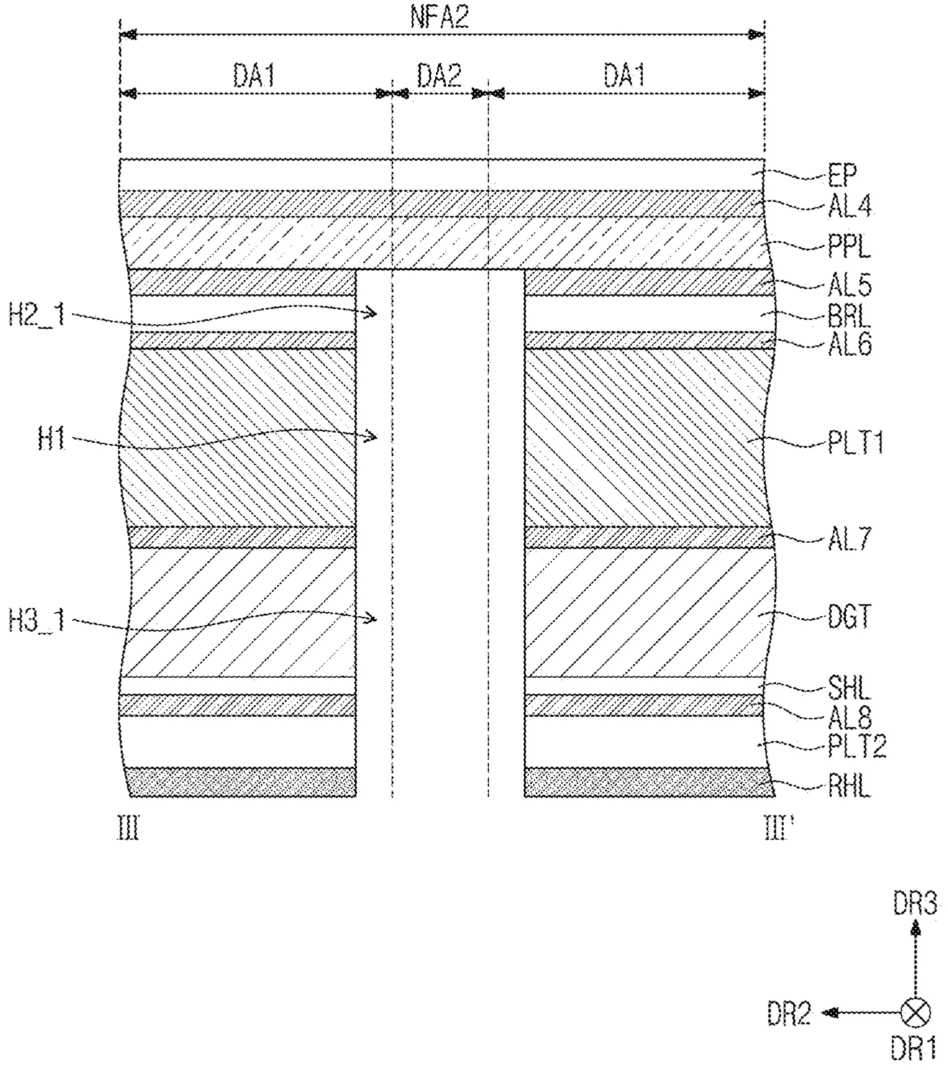
FIGS. 20 to 27 illustrate various embodiments of first, second, and third holes of the inventive concept.

Referring to FIG. 20, a first hole H1 may be defined in a first support plate PLT1, a second hole H2-1 may be defined in a barrier layer BRL and fifth and sixth adhesive layers AL5 and AL6, and a third hole H3-1 may be defined in a digitizer DGT, a shielding layer SHL, a second support plate PLT2, a heat dissipation layer RHL, and seventh and eighth adhesive layers AL7 and AL8.

In a plan view, a size of each of the first, second, and third holes H1, H2-1, and H3-1 may be larger than the size of the second display area DA2. The first, second, and third holes H1, H2-1, and H3-1 may have about the same size. Edges of the first, second, and third holes H1, H2-1, and H3-1 may overlap each other.

Figure 21:
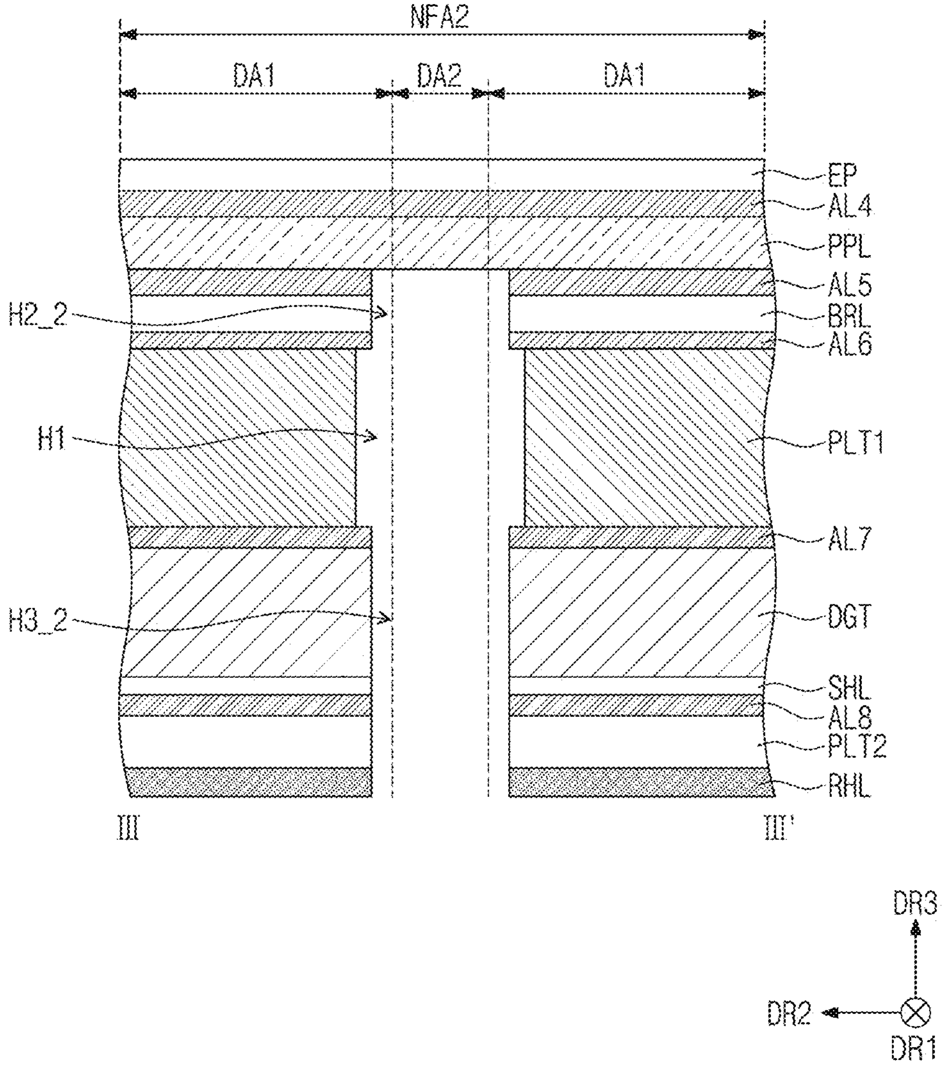

Referring to FIG. 21, a first hole H1 may be defined in a first support plate PLT1, a second hole H2-2 may be defined in a barrier layer BRL and fifth and sixth adhesive layers AL5 and AL6, and a third hole H3-2 may be defined in a digitizer DGT, a shielding layer SHL, a second support plate PLT2, a heat dissipation layer RHL, and seventh and eighth adhesive layers AL7 and AL8.

In a plan view, a size of each of the first, second, and third holes H1, H2-2, and H3-2 may be larger than the size of the second display area DA2. The second hole H2-2 may have a smaller size than the first hole H1. The third hole H3-2 may have a smaller size than the first hole H1. The second hole H2-2 may have about the same size as the third hole H3-2. An edge of the first hole H1 may be disposed more outward than edges of the second and third holes H2-2 and H3-2. The edges of the second and third holes H2-2 and H3-2 may overlap each other.

Figure 22:
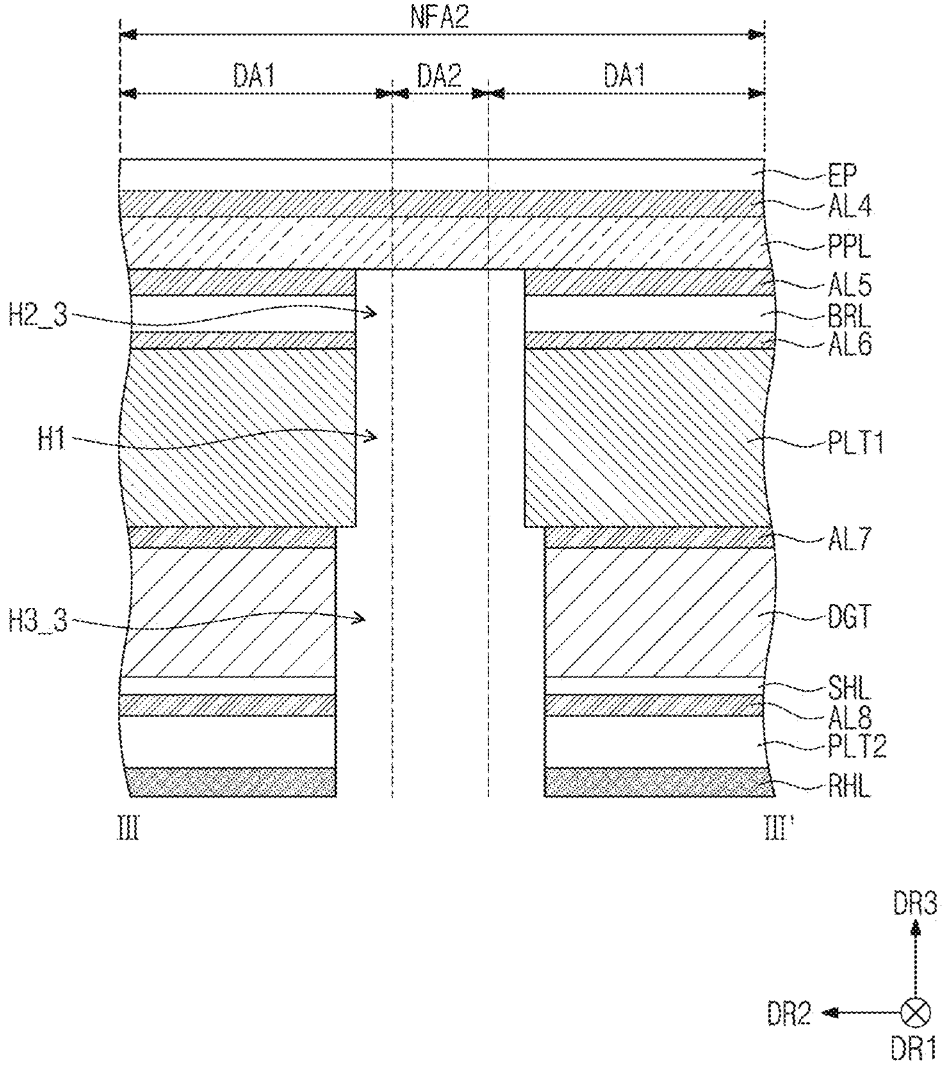

Referring to FIG. 22, a first hole H1 may be defined in a first support plate PLT1, a second hole H2-3 may be defined in a barrier layer BRL and fifth and sixth adhesive layers AL5 and AL6, and a third hole H3-3 may be defined in a digitizer DGT, a shielding layer SHL, a second support plate PLT2, a heat dissipation layer RHL, and seventh and eighth adhesive layers AL7 and AL8.

In a plan view, a size of each of the first, second, and third holes H1, H2-3, and H3-3 may be larger than the size of the second display area DA2. The second hole H2-3 may have about the same size as the first hole H1. The third hole H3-3 may have a larger size than the first hole H1. Edges of the first and second holes H1 and H2-3 may overlap each other. An edge of the third hole H3-3 may be disposed more outward than the edges of the first and second holes H1 and H2-3.

Figure 23:
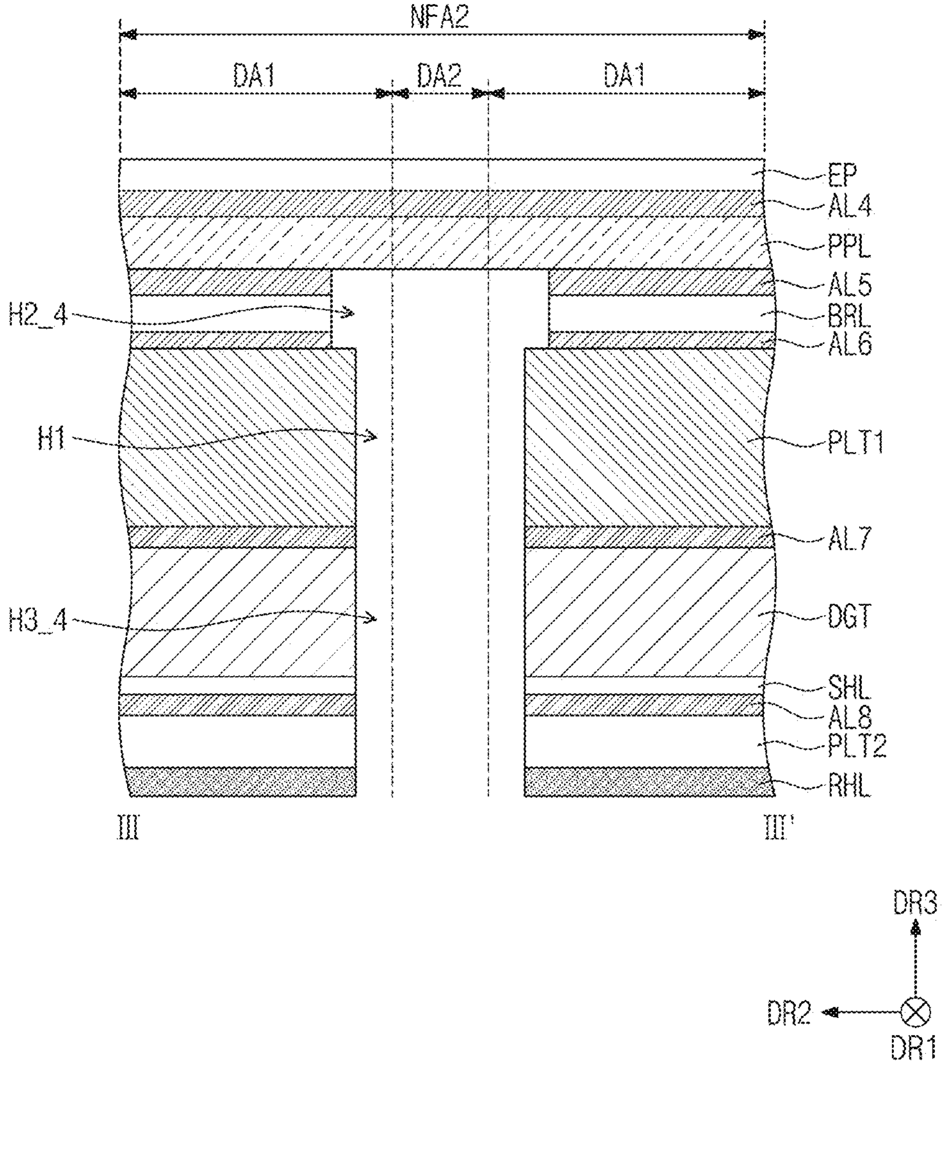

Referring to FIG. 23, a first hole H1 may be defined in a first support plate PLT1, a second hole H2-4 may be defined in a barrier layer BRL and fifth and sixth adhesive layers AL5 and AL6, and a third hole H3-4 may be defined in a digitizer DGT, a shielding layer SHL, a second support plate PLT2, a heat dissipation layer RHL, and seventh and eighth adhesive layers AL7 and AL8.

In a plan view, a size of each of the first, second, and third holes H1, H2-4, and H3-4 may be larger than the size of the second display area DA2. The second hole H2-4 may have a larger size than the first hole H1. The third hole H3-4 may have the same size as the first hole H1. An edge of the second hole H2-4 may be disposed more outward than an edge of the first hole H1. The edge of the first hole H1 may overlap an edge of the third hole H3-4.

Figure 24:
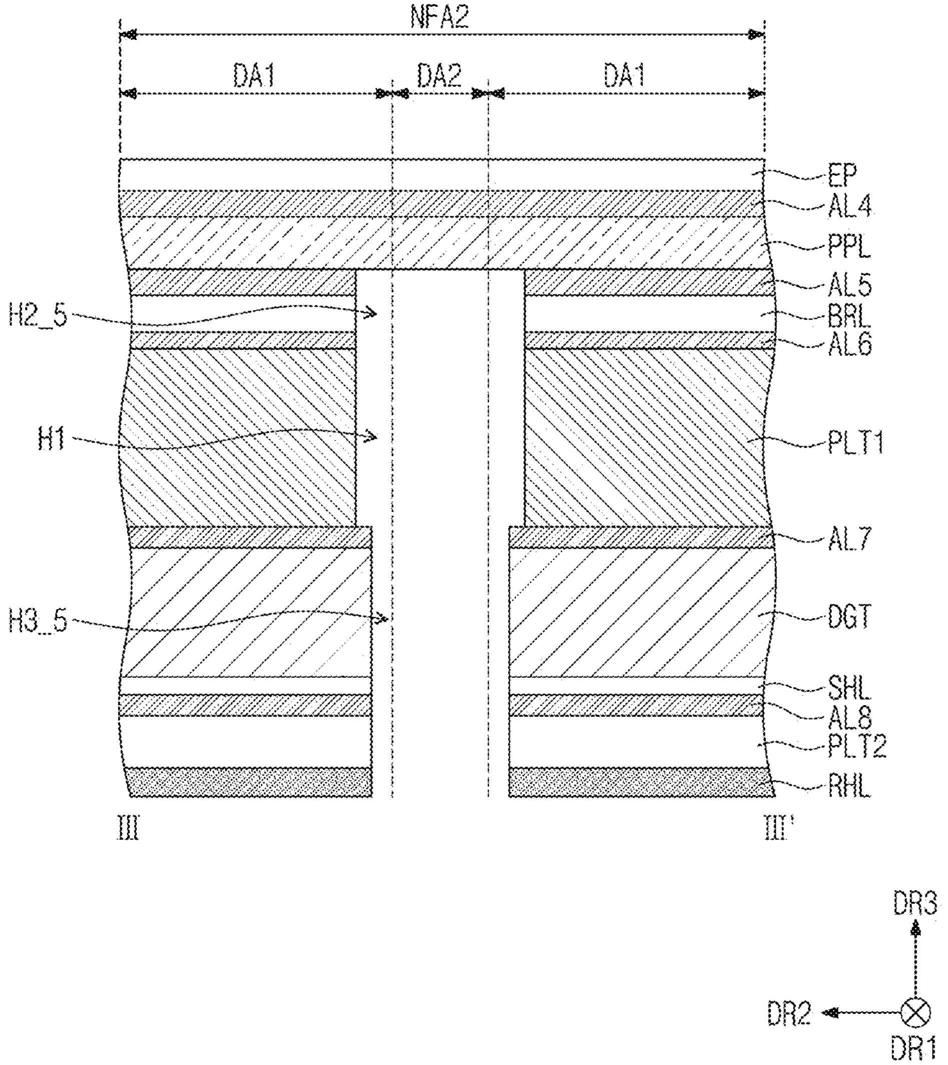

Referring to FIG. 24, a first hole H1 may be defined in a first support plate PLT1, a second hole H2-5 may be defined in a barrier layer BRL and fifth and sixth adhesive layers AL5 and AL6, and a third hole H3-5 may be defined in a digitizer DGT, a shielding layer SHL, a second support plate PLT2, a heat dissipation layer RHL, and seventh and eighth adhesive layers AL7 and AL8.

In a plan view, a size of each of the first, second, and third holes H1, H2-5, and H3-5 may be larger than the size of the second display area DA2. The second hole H2-5 may have about the same size as the first hole H1. The third hole H3-5 may have a smaller size than the first hole H1. Edges of the first and second holes H1 and H2-5 may overlap each other. The edges of the first and second holes H1 and H2-5 may be disposed more outward than an edge of the third hole H3-5.

Figure 25:
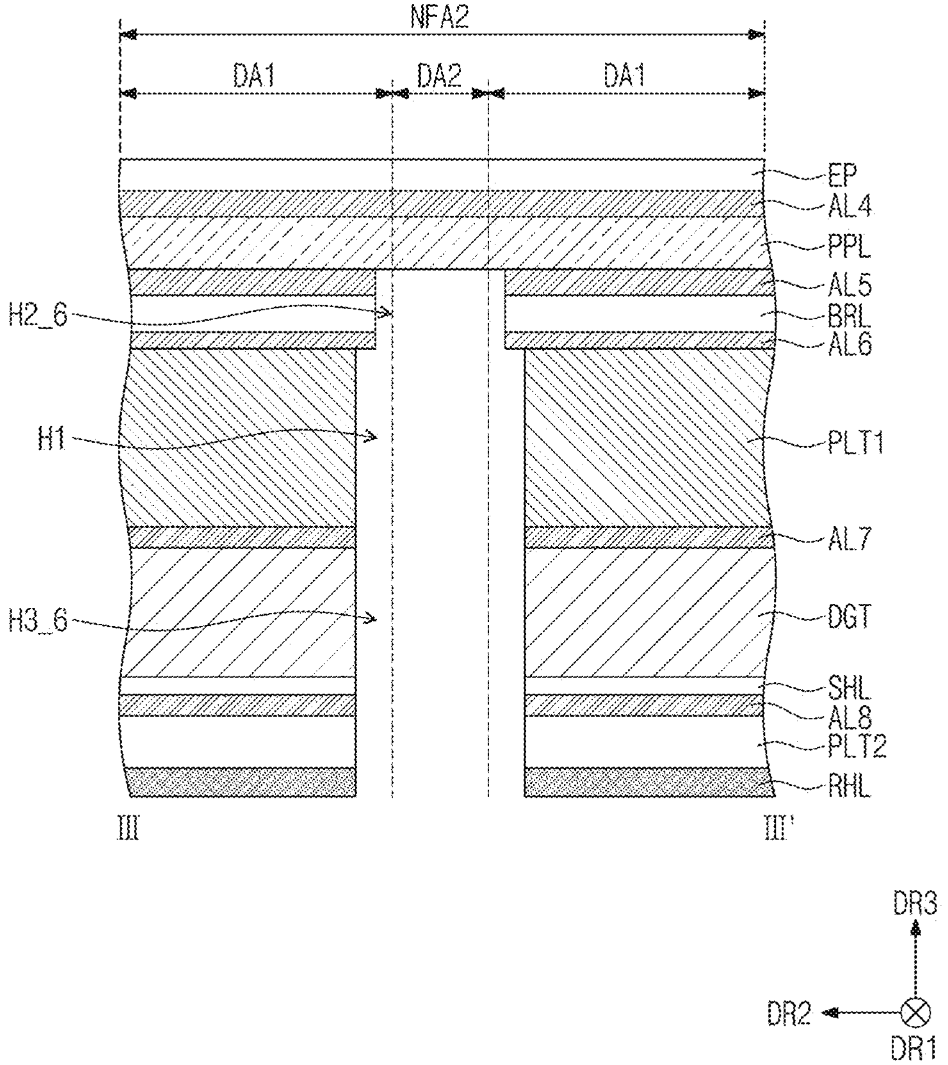

Referring to FIG. 25, a first hole H1 may be defined in a first support plate PLT1, a second hole H2-6 may be defined in a barrier layer BRL and fifth and sixth adhesive layers AL5 and AL6, and a third hole H3-6 may be defined in a digitizer DGT, a shielding layer SHL, a second support plate PLT2, a heat dissipation layer RHL, and seventh and eighth adhesive layers AL7 and AL8.

In a plan view, a size of each of the first, second, and third holes H1, H2-6, and H3-6 may be larger than the size of the second display area DA2. The third hole H3-6 may have about the same size as the first hole H1. The second hole H2-6 may have a smaller size than the first hole H1. Edges of the first and third holes H1 and H3-6 may overlap each other. The edges of the first and third holes H1 and H3-6 may be disposed more outward than an edge of the second hole H2-6.

Figure 26:
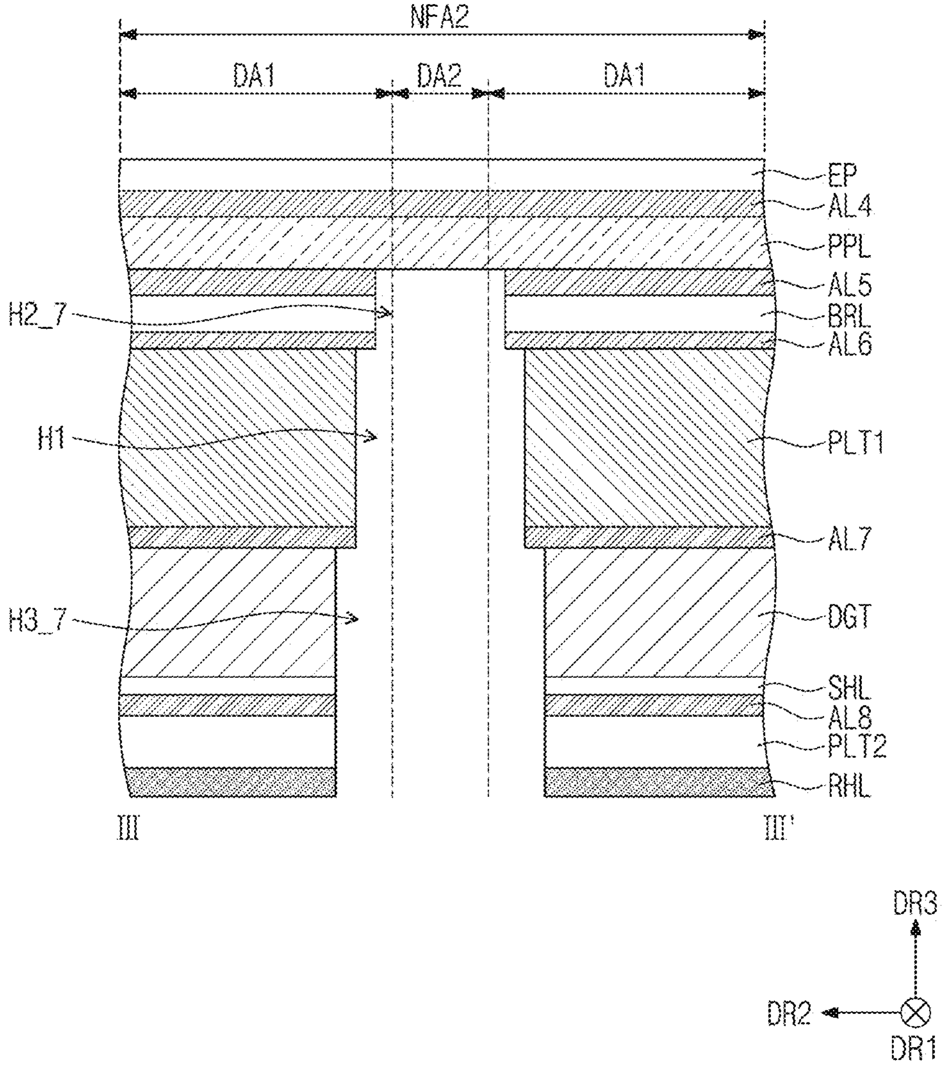

Referring to FIG. 26, a first hole H1 may be defined in a first support plate PLT1, a second hole H2-7 may be defined in a barrier layer BRL and fifth and sixth adhesive layers AL5 and AL6, and a third hole H3-7 may be defined in a digitizer DGT, a shielding layer SHL, a second support plate PLT2, a heat dissipation layer RHL, and seventh and eighth adhesive layers AL7 and AL8.

In a plan view, a size of each of the first, second, and third holes H1, H2-7, and H3-7 may be larger than the size of the second display area DA2. The second hole H2-7 may have a smaller size than the first hole H1. The third hole H3-7 may have a larger size than the first hole H1. An edge of the first hole H1 may be disposed more outward than an edge of the second hole H2-7. An edge of the third hole H3-7 may be disposed more outward than the edge of the first hole H1.

Figure 27:
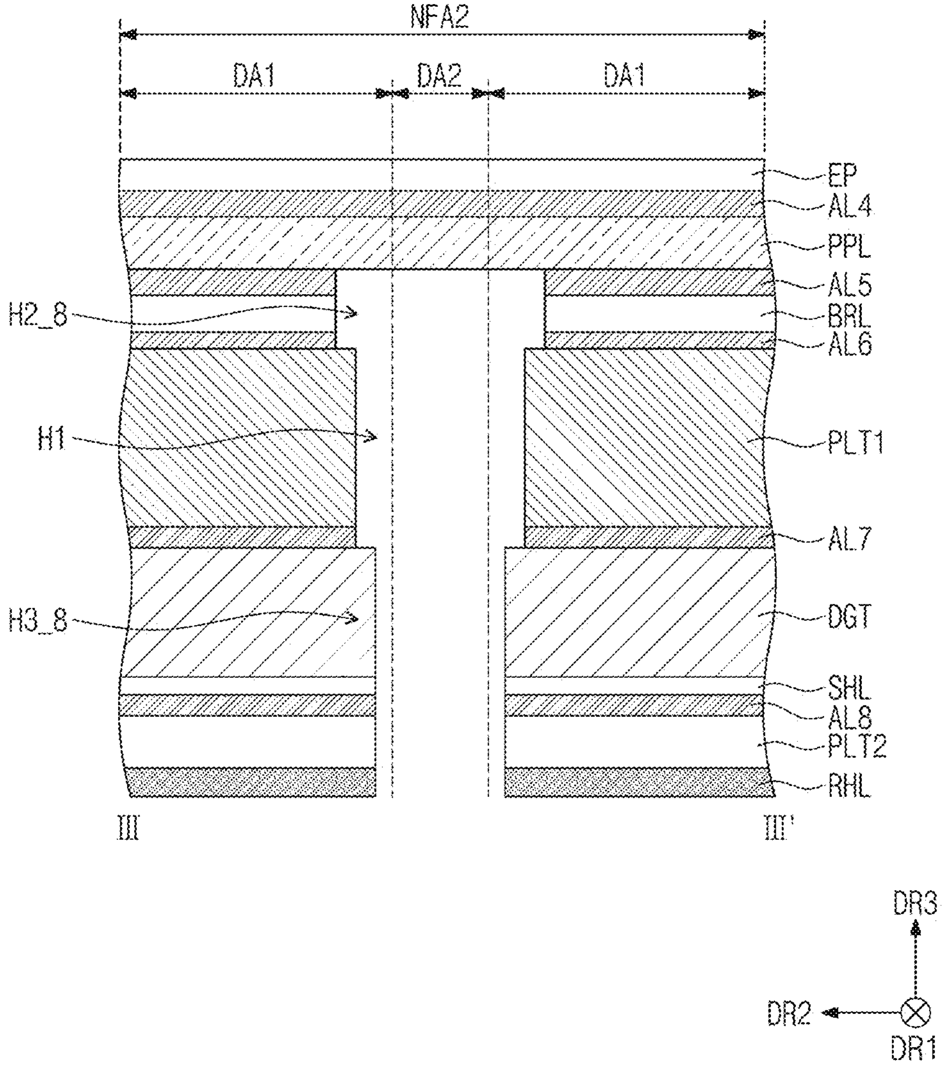

Referring to FIG. 27, a first hole H1 may be defined in a first support plate PLT1, a second hole H2-8 may be defined in a barrier layer BRL and fifth and sixth adhesive layers AL5 and AL6, and a third hole H3-8 may be defined in a digitizer DGT, a shielding layer SHL, a second support plate PLT2, a heat dissipation layer RHL, and seventh and eighth adhesive layers AL7 and AL8.

In a plan view, a size of each of the first, second, and third holes H1, H2-8, and H3-8 may be larger than the size of the second display area DA2. The second hole H2-8 may have a larger size than the first hole H1. The third hole H3-8 may have a smaller size than the first hole H1. An edge of the second hole H2-8 may be disposed more outward than an edge of the first hole H1. The edge of the first hole H1 may be disposed more outward than an edge of the third hole H3-8.

Figure 28A:
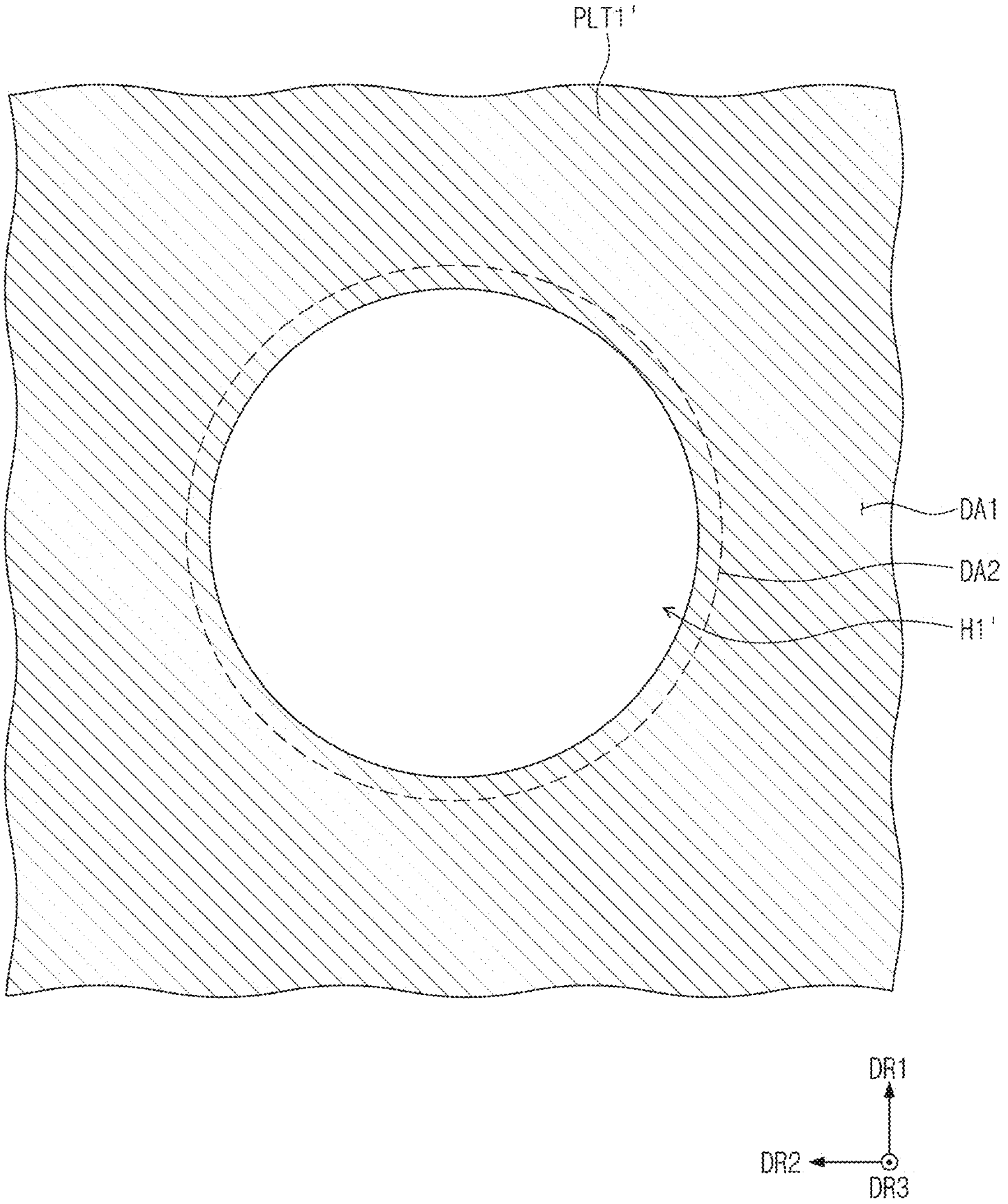
FIGS. 28A to 28C illustrate planar configurations of a comparative support plate.
Figure 28B:
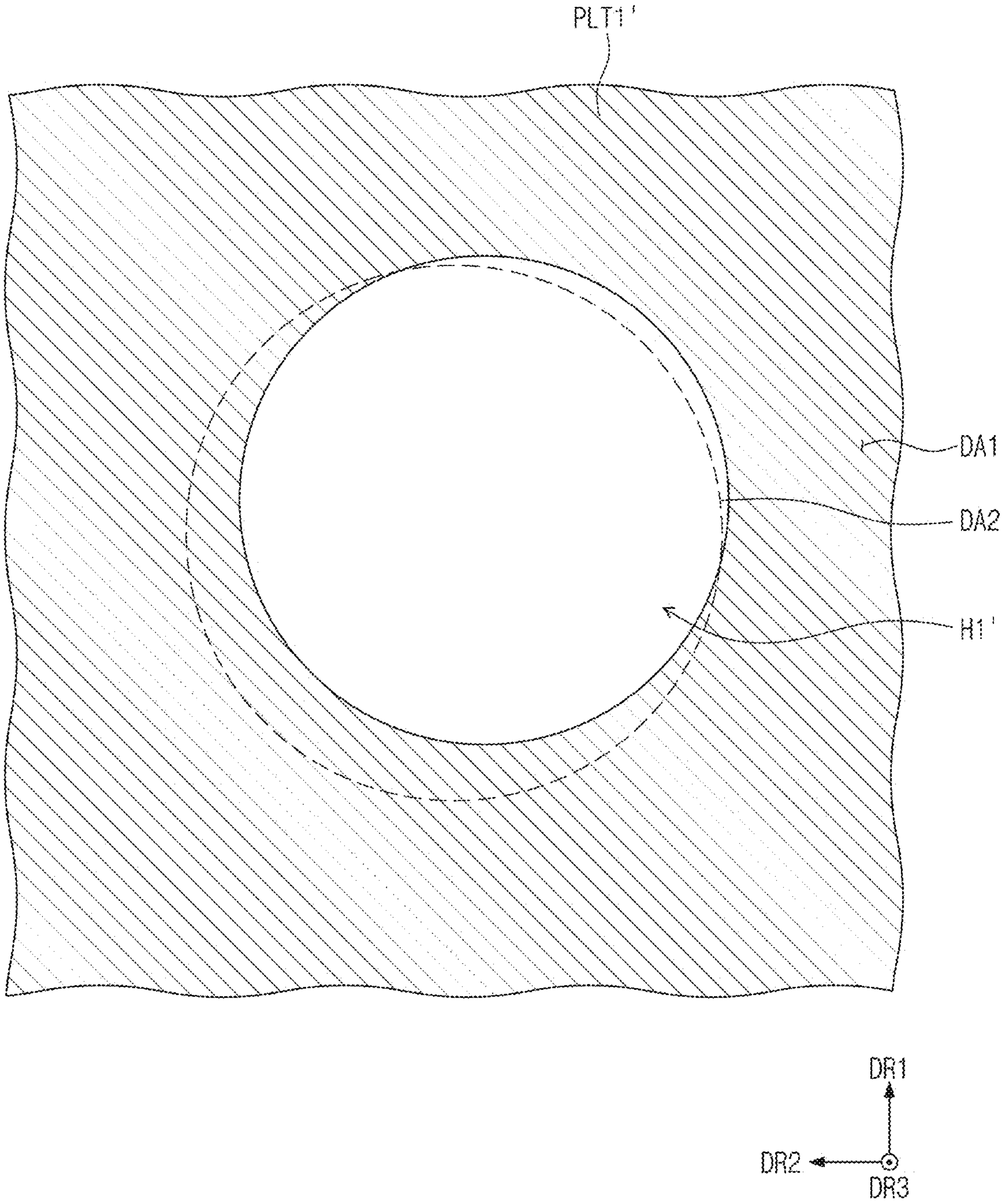
Figure 28C:
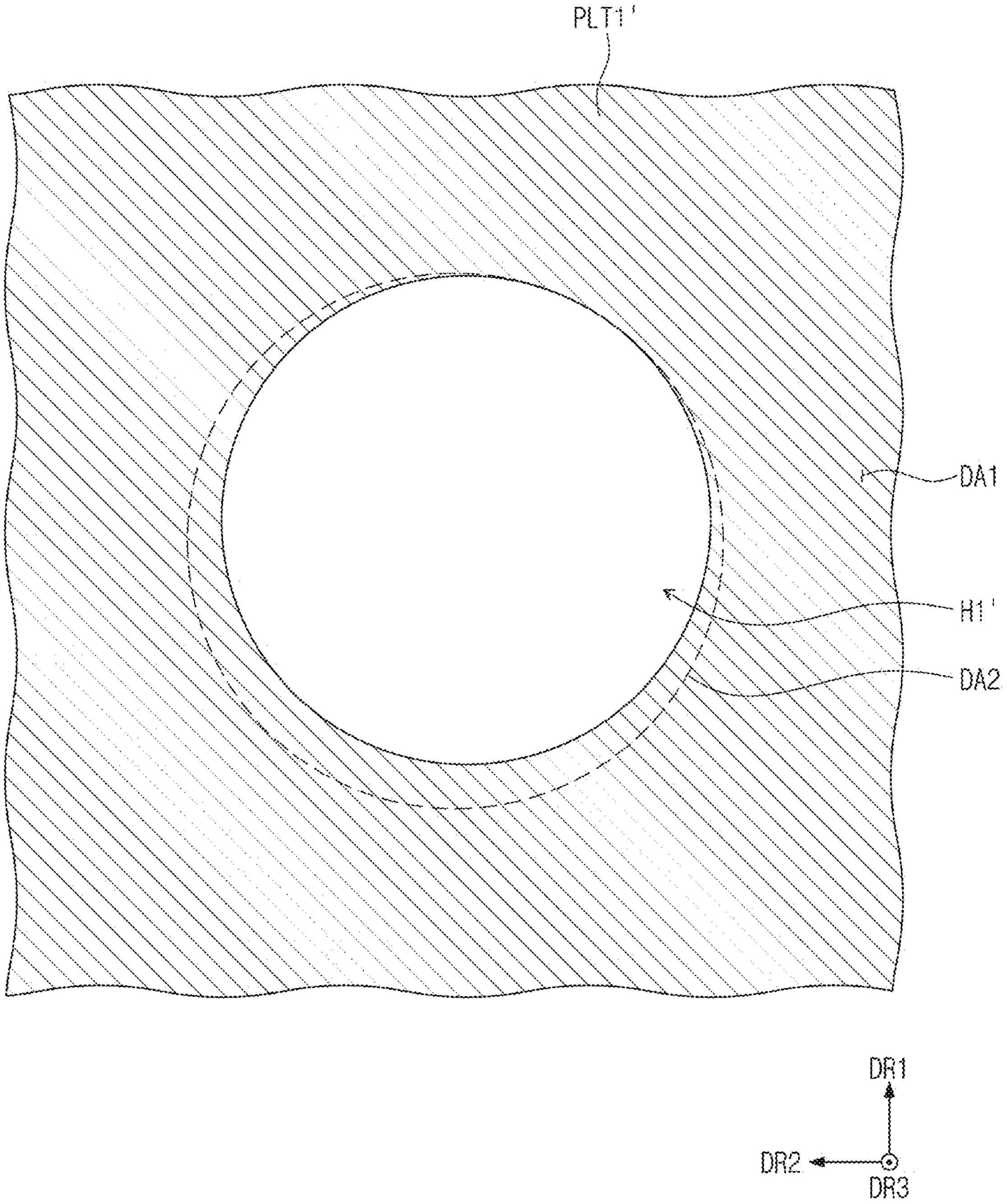

FIGS. 28A to 28C illustrate planar configurations of a comparative support plate.

Referring to FIGS. 28A to 28C, a comparative support plate PLT1' may be disposed in the same layer as the first support plate PLT1 of an embodiment of the inventive concept. A first hole H1' may be defined in the comparative support plate PLT1'. A size of the first hole H1' may be smaller than the size of the second display area DA2.

Referring to FIG. 28A, when the display device DD is manufactured, the comparative support plate PLT1' may be aligned so that the first hole H1' is disposed inside the second display area DA2. The edge of the second display area DA2 may be disposed more outward than an edge of the first hole H1'. When the first hole H1' and the second display area DA2 are normally aligned, a gap between the edge of the second display area DA2 and the edge of the first hole H1' may be uniform.

Referring to FIG. 28B and FIG. 28C, when the display device DD is manufactured, the first hole H1' and the second display area DA2 may not be normally aligned, and thus, misalignment therebetween may occur. For example, as illustrated in FIG. 28B, a portion of the edge of the first hole H1' may be disposed more outward than a portion of the edge of the second display area DA2. In addition, as illustrated in FIG. 28C, a portion of the edge of the first hole H1' may overlap a portion of the edge of the second display area DA2.

Figure 29:
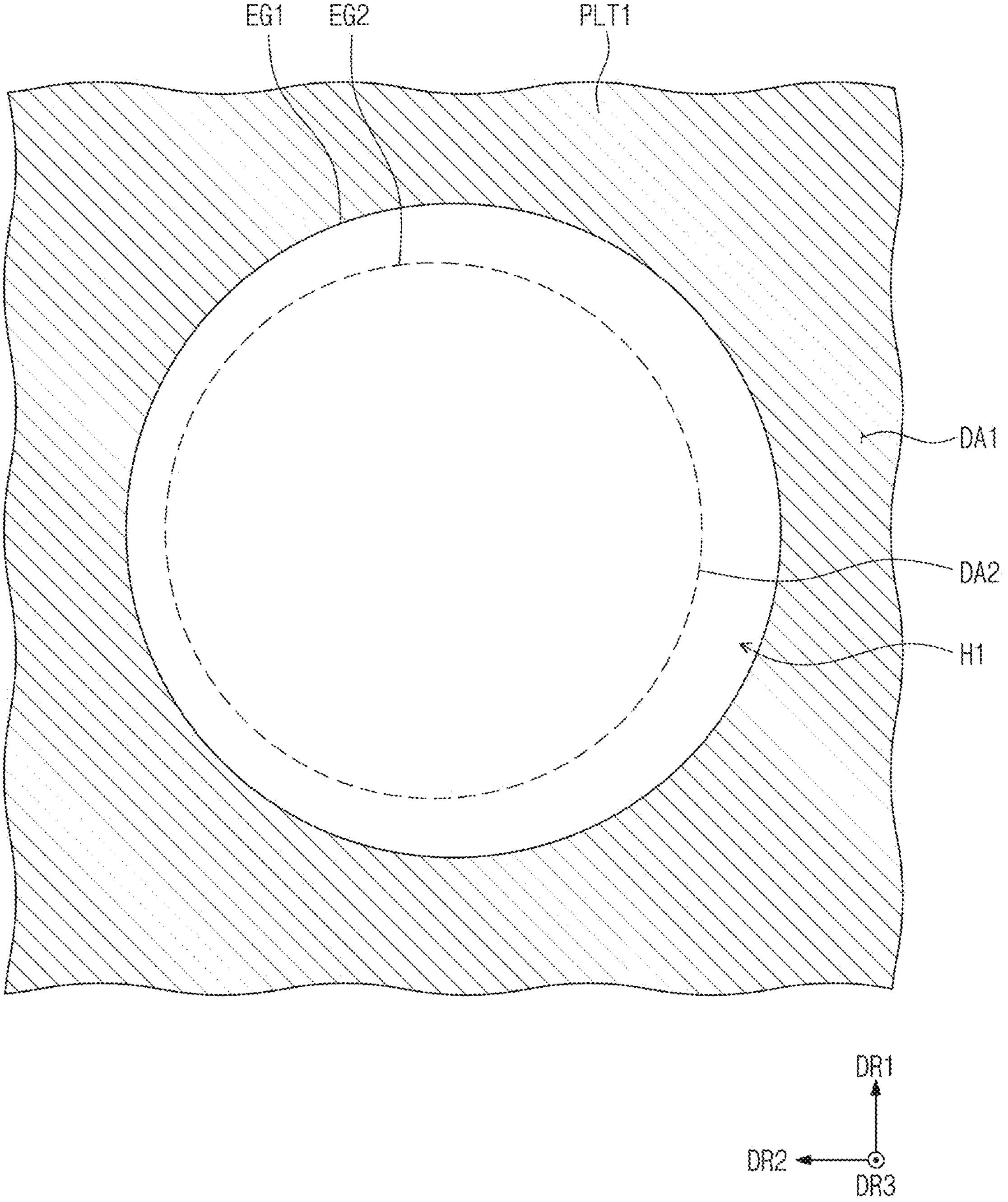
FIG. 29 illustrates misalignment between the first hole and the second display area illustrated in FIG. 18.

FIG. 29 illustrates misalignment between the first hole and the second display area illustrated in FIG. 18.

Referring to FIG. 29, when misalignment between the first hole H1 and the second display area DA2 occurs, a gap between the first edge EG1 of the first hole H1 and the second edge EG2 of the second display area DA2 may not be uniform. In an embodiment of the inventive concept, even when the misalignment occurs, the second display area DA2 may be disposed inside the first hole H1.

Figure 30:
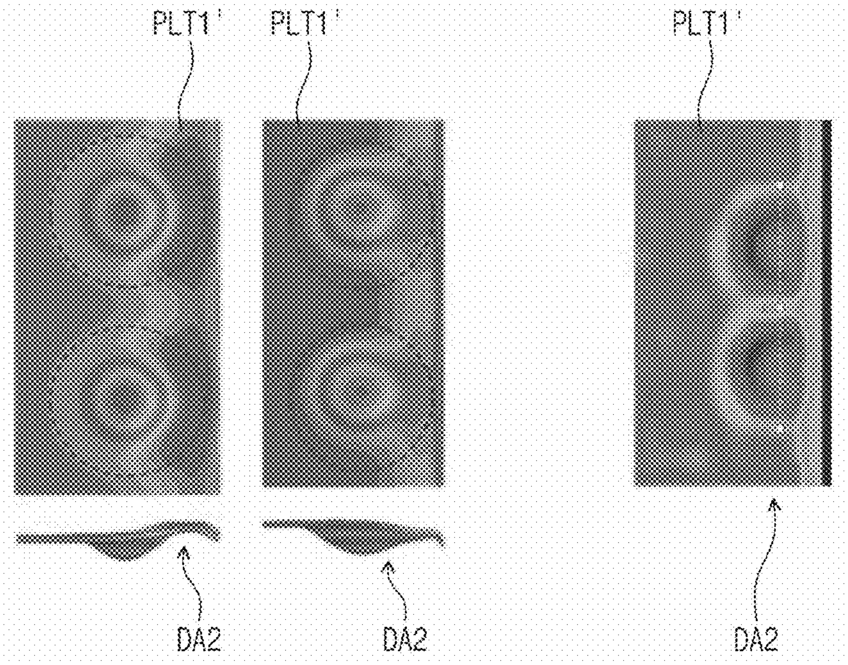
FIG. 30 illustrates experimental images according to misalignment between a first hole defined in a comparative support plate and a second display area.
Figure 31:
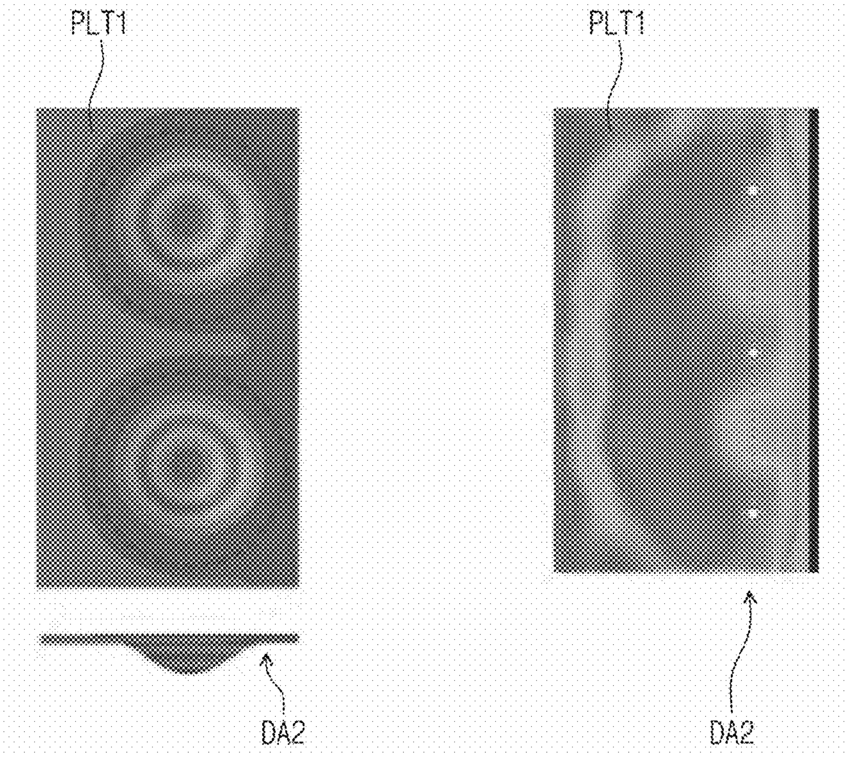
FIG. 31 illustrates experimental images according to misalignment between a first hole defined in a first support plate and a second display area according to an embodiment of the inventive concept.

FIG. 30 illustrates experimental images according to misalignment between a first hole defined in a comparative support plate and a second display area. FIG. 31 illustrates experimental images according to misalignment between a first hole defined in a first support plate and a second display area according to an embodiment of the inventive concept.

FIGS. 30 and 31 are images obtained by photographing, from above the display device DD, portions of the display device DD in which the first and second transmissive areas TA1 and TA2 are disposed. As the first hole H1' and the first hole H1 described above are formed, a portion of the display module DM and a portion of the window module WM that are disposed on the first hole H1' and the first hole H1 may sag downward toward the first hole H1' and the first hole H1.

The images, similar to holes, illustrated in FIGS. 30 and 31, may be images of the display device DD according to this sagging state. One of the images, similar to holes, illustrated in FIGS. 30 and 31, may represent a portion of the second display area DA2 defined by the first transmissive area TA1. Hereinafter, a sagging state of the second display area DA2 will be described.

Referring to FIG. 30, two plan views on the left side and two cross-sectional views thereunder respectively represent plan views of the second display area DA2 and cross-sectional views of the second display area DA2 according to various misalignment states. Referring to the cross-sectional views, as the first hole H1' is formed, a portion of the second display area DA2 disposed on the first hole H1' may sag downward.

A plan view on the right side of FIG. 30 may represent height variation of the sagging state of the second display area DA2. For example, in the plan view on the right side of FIG. 30, a large difference in color indicates a high state of nonuniform sagging.

As illustrated in FIGS. 28B and 28C, when the size of the first hole H1' is smaller than the size of the second display area DA2, and misalignment occurs, an inner surface (the edge of the first hole H1') of the comparative support plate PLT1' defining the first hole H1' may affect a boundary of the second display area DA2.

As illustrated in FIGS. 28B and 28C, when the inner surface of the comparative support plate PLT1' is disposed adjacent to the boundary of the second display area DA2 due to the misalignment, the sagging state of the second display area DA2 may be nonuniform as in the left cross-sectional views illustrated in FIG. 30. For example, referring to the cross-sectional views, a portion of the boundary of the second display area DA2 may rise upward or sag downward.

When the sagging state of the second display area DA2 is nonuniform as illustrated in FIG. 30, an external image provided to the camera through the second display area DA2 may be distorted. Accordingly, the image quality of the camera may deteriorate.

Referring to FIG. 31, a plan view on the left side and a cross-sectional view thereunder respectively represent a plan view of the second display area DA2 and a cross-sectional view of the second display area DA2 according to misalignment between the first hole H1 and the second display area DA2 illustrated in FIG. 29. Referring to the cross-sectional view, as the first hole H1 is formed, a portion of the second display area DA2 disposed on the first hole H1 may sag downward.

A plan view on the right side of FIG. 31 represents height variation of the sagging state of the second display area DA2. A difference in color in the plan view on the right side of FIG. 31 is smaller than the difference in color in the plan view on the right side of FIG. 30. The small difference in color in the plan view on the right side of FIG. 31 indicates a state in which the sagging nonuniformity of the second display area DA2 is low. That is, the plan view on the right side of FIG. 31 represents more uniform sagging state of the second display area DA2 than the plan view on the right side of FIG. 30. Referring to the cross-sectional view of FIG. 31, the sagging state of the second display area DA2 is more uniform in FIG. 31 than in FIG. 30.

As illustrated in FIG. 29, when the size of the first hole H1 is greater than the size of the second display area DA2, and misalignment occurs, there may be a high possibility that the second display area DA2 is disposed inside the first hole H1. In this case, an inner surface (the edge of the first hole H1) of the first support plate PLT1 may not affect the boundary of the second display area DA2. Accordingly, even when misalignment occurs, the sagging state may be uniform as illustrated in the cross-sectional view on the left side of FIG. 31. A portion of the boundary of the second display area DA2 may not rise upward or sag downward.

When the sagging state of the second display area DA2 is uniform, distortion of an external image provided to the camera through the second display area DA2 may be reduced. As a result, the image quality of the camera may be increased.

According to an embodiment of the inventive concept, the first hole of the first support plate may be formed to be larger than the second display area disposed on the first hole, and the edge of the first hole may be disposed more outward than the edge of the second display area. In this case, the sagging state of the second display area may be uniform, and thus, the image quality of the camera may be increased.

As is traditional in the field of the inventive concept, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

While the present inventive concept has been particularly shown and described with reference to embodiments thereof, it will be understood by those of ordinary skill in the art that various changes in form and detail may be made therein without departing from the spirit and scope of the present inventive concept as defined by the following claims.

What is claimed is:

1. A display device, comprising:

a display panel comprising a folding area and a non-folding area disposed adjacent to the folding area; and a first support plate disposed on a lower portion of the display panel, wherein the non-folding area comprises:

a first display area; and a second display area disposed adjacent to the first display area and having a higher light transmittance than the first display area, wherein each of the first display area and the second display area displays an image, wherein a first hole overlapping the second display area displaying the image is defined in the first support plate in the non-folding area, and a size of the first hole is larger than a size of the second display area displaying the image in a plan view.

2. The display device of claim 1, wherein an edge of the first hole is disposed more outward than an edge of the second display area.

3. The display device of claim 2, wherein a distance between the edge of the first hole and the edge of the second display area is about 0.2 to about 0.7 times a distance between a center of the second display area and the edge of the second display area.

4. The display device of claim 1, wherein the first display area comprises a plurality of first pixels, and the second display area comprises:

a plurality of second pixels; and a plurality of transmissive portions disposed around each of the second pixels, wherein the first display area does not comprise the transmissive portions.

5. The display device of claim 1, wherein a plurality of openings are defined in a folding plate of the first support plate overlapping the folding area.

6. The display device of claim 5, further comprising:

a cover layer disposed on a lower portion of the folding plate, wherein the cover layer covers the openings.

7. The display device of claim 1, further comprising:

a barrier layer disposed between the display panel and the first support plate; and a plurality of adhesive layers respectively disposed between the display panel and the barrier layer, and between the barrier layer and the first support plate, wherein a second hole is defined in the barrier layer and the adhesive layers, wherein a size of the second hole is larger than the size of the second display area in the plan view.

8. The display device of claim 7, wherein an adhesive layer among the plurality of adhesive layers is disposed between the first support plate and the barrier layer, and the adhesive layer overlaps the non-folding area and does not overlap the folding area.

9. The display device of claim 7, wherein the size of the second hole is larger than the size of the first hole in the plan view.

10. The display device of claim 7, wherein the size of the second hole is about the same as the size of the first hole in the plan view.

11. The display device of claim 7, wherein the size of the second hole is smaller than the size of the first hole in the plan view.

12. The display device of claim 7, further comprising a plurality of functional layers disposed on a lower portion of the first support plate, wherein a third hole is defined in the functional layers, wherein a size of the third hole is larger than the size of the second display area in the plan view.

13. The display device of claim 12, wherein the functional layers comprise:

a digitizer disposed on the lower portion of the first support plate;

a shielding layer disposed on a lower portion of the digitizer; and a heat dissipation layer disposed on a lower portion of the shielding layer.

14. The display device of claim 12, wherein the size of the third hole is larger than the size of the first hole in the plan view.

15. The display device of claim 12, wherein the size of the third hole is about the same as the size of the first hole in the plan view.

16. The display device of claim 12, wherein the size of the third hole is smaller than the size of the first hole in the plan view.

17. The display device of claim 12, wherein the size of the second hole is different from the size of the third hole in the plan view.

18. The display device of claim 12, wherein the size of the second hole is about the same size as the size of the third hole in the plan view.

19. A display device, comprising:

a display panel comprising a folding area and a non-folding area disposed adjacent to the folding area;

a first support plate disposed on a lower portion of the display panel;

a first functional layer disposed between the display panel and the first support plate; and a second functional layer disposed on a lower portion of the first support plate, wherein the non-folding area comprises:

a first display area; and a second display area disposed adjacent to the first display area and having a higher light transmittance than the first display area, wherein each of the first display area and the second display area displays an image, wherein a first hole overlapping the second display area is displaying the image defined in the first support plate, a second hole overlapping the second display area is defined in the first functional layer, and a third hole overlapping the second display area is defined in the second functional layer, and in a plan view, a size of each of the first, second, and third holes is larger than a size of the second display area displaying the image, and the size of the first hole is different from the size of each of the second and third holes.

20. An electronic device, comprising:

a display device in which a first transmissive area through which an optical signal passes is defined;

an electro-optical device disposed below the display device, overlapping the first transmissive area, and configured to receive the optical signal; and a case configured to accommodate the display device and the electro-optical device, wherein the display device comprises:

a display panel comprising a folding area and a non-folding area disposed adjacent to the folding area; and a first support plate disposed on a lower portion of the display panel, wherein the non-folding area comprises:

a first display area; and a second display area disposed adjacent to the first display area and having a higher light transmittance than the first display area, wherein each of the first display area and the second display area displays an image, wherein a first hole overlapping the second display area displaying the image is defined in the first support plate in the non-folding area, and a size of the first hole is larger than a size of the second display area displaying the image in a plan view.

* * * * *